(12) United States Patent
Zafar et al.

(10) Patent No.: US 12,406,837 B2
(45) Date of Patent: Sep. 2, 2025

(54) REACTION CELL FOR SPECIES SENSING

(71) Applicant: Applied Materials, Inc., Santa Clara, CA (US)

(72) Inventors: Abdullah Zafar, Santa Clara, CA (US); Kelvin Chan, San Ramon, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 17/841,557

(22) Filed: Jun. 15, 2022

(65) Prior Publication Data

US 2023/0411130 A1 Dec. 21, 2023

(51) Int. Cl.
*G01N 21/35* (2014.01)
*H01J 37/32* (2006.01)
*G01N 21/27* (2006.01)

(52) U.S. Cl.
CPC .......... *H01J 37/3299* (2013.01); *G01N 21/35* (2013.01); *H01J 37/32357* (2013.01); *G01N 21/27* (2013.01); *G01N 2201/06113* (2013.01); *H01J 2237/24585* (2013.01)

(58) Field of Classification Search
CPC ................... G01N 21/35; G01N 21/27; G01N 2201/06113; H01J 37/3299; H01J 37/32357
See application file for complete search history.

(56) References Cited

U.S. PATENT DOCUMENTS

| | | | |
|---|---|---|---|
| 5,180,435 A * | 1/1993 | Markunas | C23C 16/452 118/724 |
| 5,326,404 A | 7/1994 | Sato | |
| 7,238,616 B2 * | 7/2007 | Agarwal | H01J 37/32339 438/681 |
| 10,867,787 B2 * | 12/2020 | Wu | H01L 21/02274 |
| 2002/0011210 A1 * | 1/2002 | Satoh | C23C 16/4405 118/723 R |
| 2002/0036066 A1 * | 3/2002 | Ogawa | H01J 37/3244 257/E21.252 |
| 2002/0073922 A1 | 6/2002 | Frankel et al. | |

(Continued)

FOREIGN PATENT DOCUMENTS

| | | |
|---|---|---|
| KR | 1020180007027 A | 1/2018 |
| TW | 201430939 A | 8/2014 |

(Continued)

OTHER PUBLICATIONS

International Search Report and Written Opinion from PCT/US2023/022070 dated Sep. 4, 2023, 10 pgs.

(Continued)

*Primary Examiner* — Jamel E Williams
(74) *Attorney, Agent, or Firm* — Schwabe, Williamson & Wyatt, P.C.

(57) ABSTRACT

Embodiments disclosed herein include semiconductor processing tools. In an embodiment, the semiconductor processing tool comprises a plasma source, and a chamber coupled to the plasma source. In an embodiment, a pump is coupled to the chamber. In an embodiment, the semiconductor processing tool further comprises a sampling line. In an embodiment, the sampling line comprises a reaction chamber, and an absorption chamber.

19 Claims, 16 Drawing Sheets

(56) References Cited

U.S. PATENT DOCUMENTS

| | | | |
|---|---|---|---|
| 2004/0086434 A1* | 5/2004 | Gadgil | H01L 21/30655 |
| | | | 422/186.21 |
| 2006/0137612 A1* | 6/2006 | Holber | C23C 16/452 |
| | | | 156/345.35 |
| 2010/0224322 A1* | 9/2010 | Sui | H01J 37/32963 |
| | | | 156/345.25 |
| 2015/0235816 A1* | 8/2015 | Yun | H01J 37/32834 |
| | | | 118/712 |
| 2016/0086772 A1 | 3/2016 | Khaja et al. | |
| 2016/0177449 A1 | 6/2016 | Ohmori et al. | |
| 2018/0342377 A1 | 11/2018 | Gopalan et al. | |
| 2021/0159060 A1* | 5/2021 | Gopalan | C23C 16/50 |
| 2023/0411129 A1* | 12/2023 | Zafar | H01J 37/32963 |

FOREIGN PATENT DOCUMENTS

| | | | | |
|---|---|---|---|---|
| WO | WO-03081216 A2 * | 10/2003 | | C23C 14/54 |
| WO | WO-2004077515 A2 * | 9/2004 | | C23C 16/452 |
| WO | WO-2019162681 A1 * | 8/2019 | | C23C 14/34 |
| WO | 20211091780 A1 | 5/2021 | | |

OTHER PUBLICATIONS

International Search Report and Written Opinion from PCT/US2023/022237 dated Sep. 5, 2023, 9 pgs.

Official Letter for Taiwan Patent Application No. 112121819 dated Mar. 13, 2025, 10 pgs.

International Preliminary Report on Patentability for International Application No. PCT/US2023/022237, dated Dec. 26, 2024, 6 pgs.

International Preliminary Report on Patentability for International Application No. PCT/US2023/022070, dated Dec. 26, 2024, 7 pgs.

Office Action from Taiwan Patent Application No. 112118294 dated May 5, 2025, 8 pgs.

Non-Final Office Action from U.S. Appl. No. 17/841,561 dated May 15, 2025, 28 pgs.

\* cited by examiner

REACTION CELL FOR SPECIES SENSING

BACKGROUND

1) Field

Embodiments relate to the field of semiconductor manufacturing and, in particular, a laser absorption species sensor for controlling a plasma source.

2) Description of Related Art

Plasma processing tools, such as plasma deposition chamber, plasma etching chambers, and the like may rely on the generation of radical species in order to process the substrate in the processing tool. Currently, the concentration of radical species produced in a chamber is an unknown value. Additionally, plasma sources are prone to drift in their performance over time. This can lead to drastically different on-substrate results. Substrate performance is monitored daily with a dummy substrate, and plasma source parameters are adjusted in an uncertain way to compensate for chamber drift. Entire batches of substrates may be lost until the parameters of the processing tool are dialed in correctly.

Currently, no plasma source on the market employs closed-loop control of the plasma. This is largely because there is no diagnostic tool that monitors radical production. Instead, most tools use historic data to adjust tool performance. Such a process is a blind way of process control. The blind approach current used can lead to an entire day's worth of substrates on a tool being faulty. Additionally, the changes made based on the monitor substrate, using historic data, do not guarantee satisfactory performance the next day. As such, significant yield hits are currently observed in existing plasma processing tools.

SUMMARY

Embodiments disclosed herein include semiconductor processing tools. In an embodiment, the semiconductor processing tool comprises a plasma source, and a chamber coupled to the plasma source. In an embodiment, a pump is coupled to the chamber. In an embodiment, the semiconductor processing tool further comprises a sampling line. In an embodiment, the sampling line comprises a reaction chamber, and an absorption chamber.

Embodiments disclosed herein further include methods of determining a radical concentration. In an embodiment, the method comprises generating radicals with a plasma source, diverting a sample of the radicals down a sampling line, reacting the radicals with a first species to form a second species, and measuring the second species in an absorption chamber, wherein a measurement of the second species corresponds to a measurement of the radicals.

Embodiments may also include a semiconductor processing tool that comprises a remote plasma source, and a chamber fluidically coupled to the remote plasma source. In an embodiment, a pump is fluidically coupled to the chamber, and a sampling line is fluidically in parallel with the chamber. In an embodiment, the sampling line comprises a reaction chamber, and an absorption chamber.

DETAILED DESCRIPTION

Figure 1A:
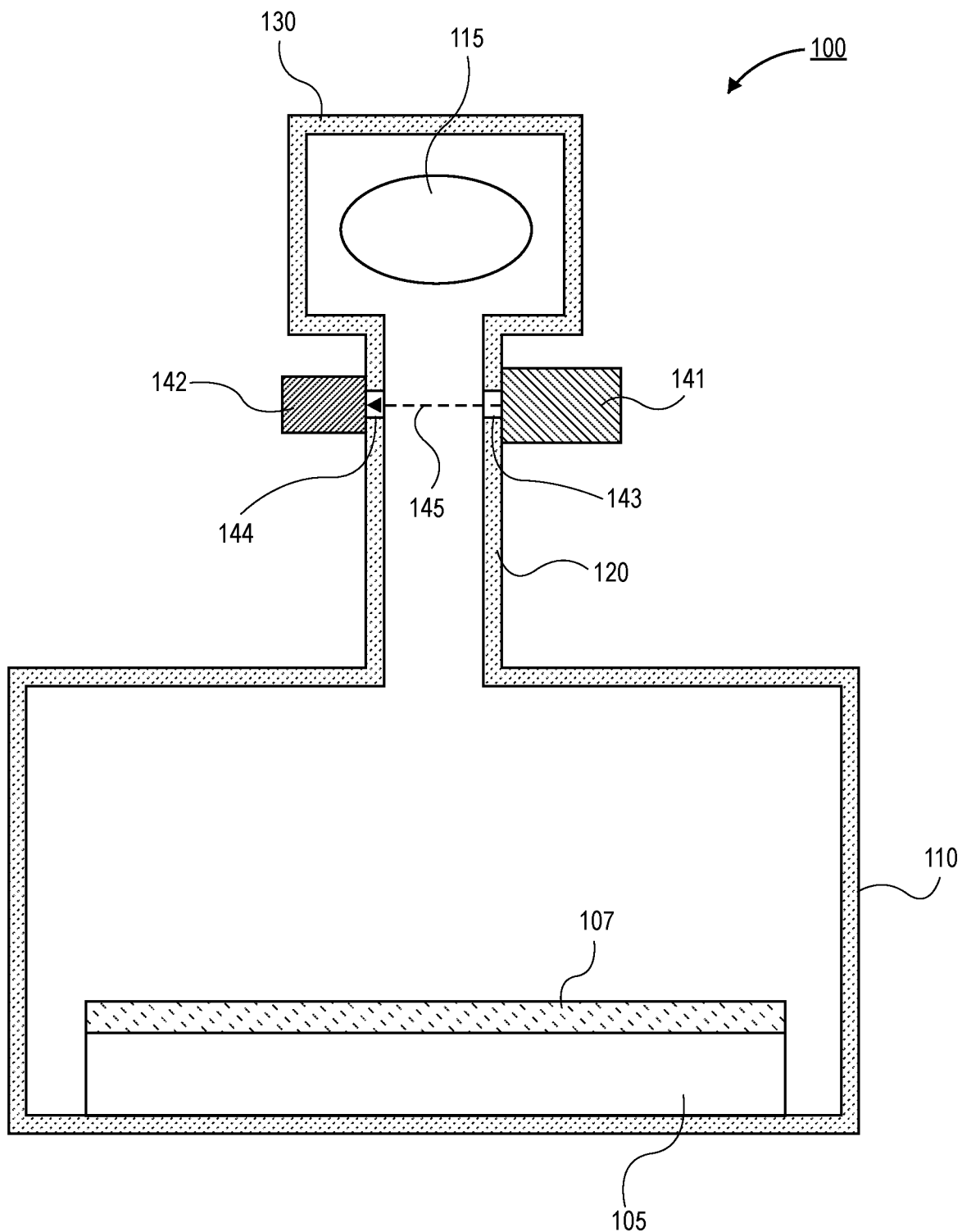
FIG. 1A is a cross-sectional illustration of a plasma processing tool with a remote plasma source (RPS) that includes a laser source and a detector provided on a pipe between the RPS and the main processing chamber, in accordance with an embodiment.

Systems described herein include a laser absorption species sensor for controlling a plasma source. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, there are currently no closed-loop control systems in plasma processing tools. Instead, dummy substrates are periodically run and changes to the plasma processing tool are made based on the historic data obtained during the dummy substrate processing. Since chamber control is dictated on historical data, it is difficult to properly dial in a process on the plasma processing tool. This may lead to significant yield losses. Additionally, once the plasma processing tool is dialed in properly, chamber drift may bring the process out of specification, and another dummy substrate may need to be run to recalibrate the tool. The inability to constantly monitor tool performance may also lead to chamber matching issues between different chambers.

Accordingly, embodiments disclosed herein include plasma processing tools that enable closed-loop control. The closed-loop control may be provided using laser absorption spectroscopy. Laser absorption spectroscopy includes propagating a laser through the internal volume of the chamber. The species in the chamber absorb a portion of the laser intensity. As such, by measuring the absorption of the laser with a detector, a quantitative measure of the species concentration in the chamber can be determined. The measure of the species concentration may be fed back to a plasma controller in order to modify one or more process parameters in order to return the species concentration to a desired value. For example, one or more of a gas flow rate, a power supplied to the plasma, a frequency of the plasma, a pressure in the processing chamber, and a temperature of the processing chamber may be changed in order to adjust the species concentration.

In one embodiment, the laser absorption spectroscopy may be implemented in a remote plasma source (RPS) tool. In such embodiments, the laser source and the detector may be provided along the pipe between the plasma chamber and the processing chamber. In other embodiments, the laser source and the detector may be provided in the main processing chamber. For example, the laser source and the detector may be provided within 10 mm of the substrate. Moving the laser source and the detector closer to the substrate may result in more accurate measurements of the species concentration that directly interacts with the substrate. In other embodiments, a standard plasma processing tool may be used. That is, the plasma source may induce the plasma directly in the main processing chamber above the substrate.

It is to be appreciated that not all radical or species types are compatible with laser absorption spectroscopy. In such instances, a measurement line may be provided in fluidic parallel with the main processing chamber. The measurement line may include a first chamber that is a reaction chamber. In the reaction chamber, the radical (or species) is flown into the chamber and reacted with a first gas. The first gas reacts with the radicals to form a second gas. The second gas may include species that are measureable with laser absorption spectroscopy. The second gas is then flown into a second chamber that is a measurement chamber. The second chamber may include windows in order to allow for a laser to pass through the chamber in order to determine the absorption of the second gas. The absorption of the second gas can be directly correlated back to the concentration (or flux) of the radical species.

Referring now to FIG. 1A, a cross-sectional illustration of a semiconductor processing tool 100 is shown, in accordance with an embodiment. The semiconductor processing tool 100 may include any type of plasma processing tool. For example, the semiconductor processing tool 100 may be a plasma etching or a plasma deposition chamber. The semiconductor processing tool 100 may be a standalone tool, or the semiconductor processing tool 100 may be part of a cluster tool. That is, multiple iterations of the semiconductor processing tool 100 (or different processing tools) may be mechanically coupled together by a central hub chamber.

In the illustrated embodiment, the semiconductor processing tool 100 is shown as being an RPS tool. The RPS semiconductor processing tool 100 may include a plasma chamber 130, a pipe 120, and a main processing chamber processing chamber 110. In the illustrated embodiment, the plasma chamber 130 is above the main processing chamber 110. However, embodiments are not limited to such configurations, and the plasma chamber 130 may be provided in any location around the main processing chamber 110. As shown, the plasma 115 substantially remains in the plasma chamber 130.

The plasma chamber 130 is shown as a featureless chamber for simplicity. However, it is to be appreciated that the plasma chamber 130 may comprise a lid or showerhead through which gasses are flown into the chamber. The lid may also act as an RF or microwave source in order to strike the plasma within the plasma chamber 130. In an embodiment, a volume of the plasma chamber 130 is smaller than a volume of the main processing chamber 110.

In an embodiment, the main processing chamber 110 may include a pedestal 105. In an embodiment, the pedestal 105 may include a chucking architecture. For example, the pedestal 105 may include an electrostatic chucking (ESC) architecture. The pedestal 105 may also comprise thermal control (e.g., heating or cooling) structures in order to control a temperature of the substrate 107 that is secured by the pedestal 105. In an embodiment, the substrate 107 may be any substrate suitable for semiconductor processing operations. For example, the substrate 107 may be a semiconductor wafer, such as a silicon wafer. The substrate 107 may also comprise glass, ceramic, or organic materials. In an embodiment, the substrate 107 may have any form factor. For example, the substrate 107 may be a 300 mm wafer, a 450 mm wafer or the like. An exhaust (not shown) may also be provided in the main processing chamber 110.

In an embodiment, the laser absorption spectroscopy tool may include a laser source 141 and a detector 142. The laser source 141 may be coupled over a first window 143 through the sidewall of the pipe 120, and the detector 142 may be coupled over a second window 144 through the sidewall of the pipe 120. In an embodiment, the laser source 141 and the detector 142 may be closer to the plasma chamber 130 than the main processing chamber 110.

In an embodiment, a laser 145 propagated by the laser source 141 passes through a volume of the pipe 120 and is optically coupled to the detector 142. In an embodiment, the laser source 141 may be any suitable wavelength laser suitable for laser absorption spectroscopy. For example a 1278 nm laser source 141 may be used, in accordance with an embodiment. The detector 142 may be any type of optical detector. For example, the detector 142 may be a charge-coupled device (CCD).

Figure 1B:
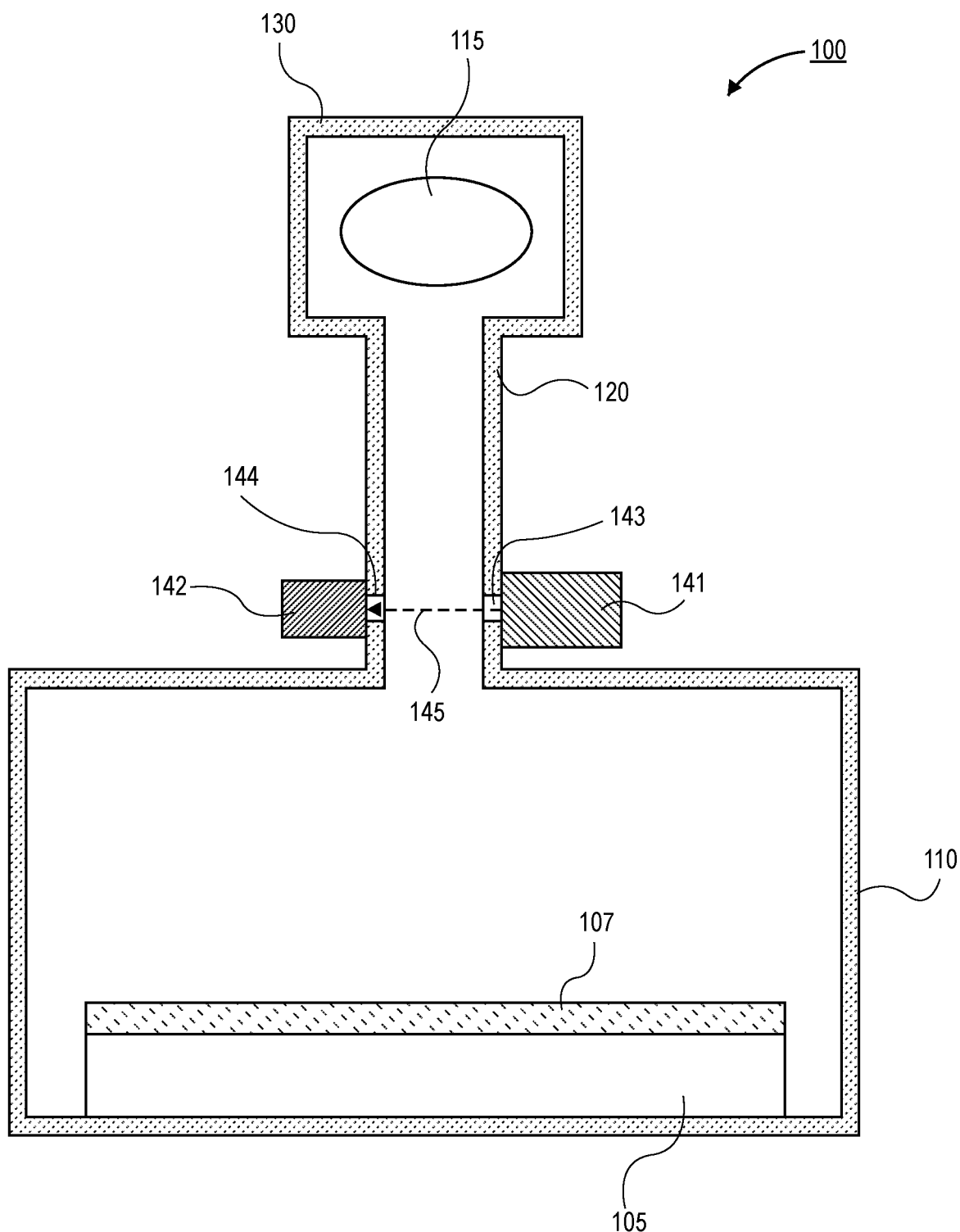
FIG. 1B is a cross-sectional illustration of a plasma processing tool with an RPS that includes a laser source and a detector provided on a pipe between the RPS and the main processing chamber, where the laser source and the detector are closer to the main processing chamber than to the RPS, in accordance with an embodiment.

Referring now to FIG. 1B, a cross-sectional illustration of a semiconductor processing tool 100 is shown, in accordance with an additional embodiment. The semiconductor processing tool 100 may include any type of plasma processing tool. For example, the semiconductor processing tool 100 may be a plasma etching or a plasma deposition chamber. The semiconductor processing tool 100 may be a standalone tool, or the semiconductor processing tool 100 may be part of a cluster tool.

In the illustrated embodiment, the semiconductor processing tool 100 is shown as being an RPS tool. The RPS semiconductor processing tool 100 may include a plasma chamber 130, a pipe 120, and a main processing chamber 110. The pipe 120 may fluidically couple the plasma chamber 130 to the main processing chamber 110.

The plasma chamber 130 is shown as a featureless chamber for simplicity. However, it is to be appreciated that the plasma chamber 130 may comprise a lid or showerhead through which gasses are flown into the chamber. The lid may also act as an RF or microwave source in order to strike the plasma within the plasma chamber 130. In an embodiment, a volume of the plasma chamber 130 is smaller than a volume of the main processing chamber 110.

In an embodiment, the main processing chamber 110 may include a pedestal 105. In an embodiment, the pedestal 105 may include a chucking architecture, such as an ESC architecture. The pedestal 105 may also comprise thermal control (e.g., heating or cooling) structures in order to control a temperature of the substrate 107 that is secured by the pedestal 105. In an embodiment, the substrate 107 may be any substrate suitable for semiconductor processing operations. For example, the substrate 107 may be a semiconductor wafer, such as a silicon wafer, though other substrate materials may also be used. An exhaust (not shown) may also be provided in the main processing chamber 110.

In an embodiment, the laser absorption spectroscopy tool may include a laser source 141 and a detector 142. The laser source 141 may be coupled over a first window 143 through the sidewall of the pipe 120, and the detector 142 may be coupled over a second window 144 through the sidewall of the pipe 120. In an embodiment, the laser source 141 and the detector 142 may be closer to the main processing chamber 110 than to the plasma chamber 130. Such an embodiment may result in the measured species concentration being closer to the species concentration that interacts with the substrate 107.

In an embodiment, a laser 145 propagated by the laser source 141 passes through a volume of the pipe 120 and is optically coupled to the detector 142. In an embodiment, the laser source 141 may be any suitable wavelength laser suitable for laser absorption spectroscopy. For example a 1278 nm laser source 141 may be used, in accordance with an embodiment. The detector 142 may be any type of optical detector. For example, the detector 142 may be a CCD.

Figure 1C:
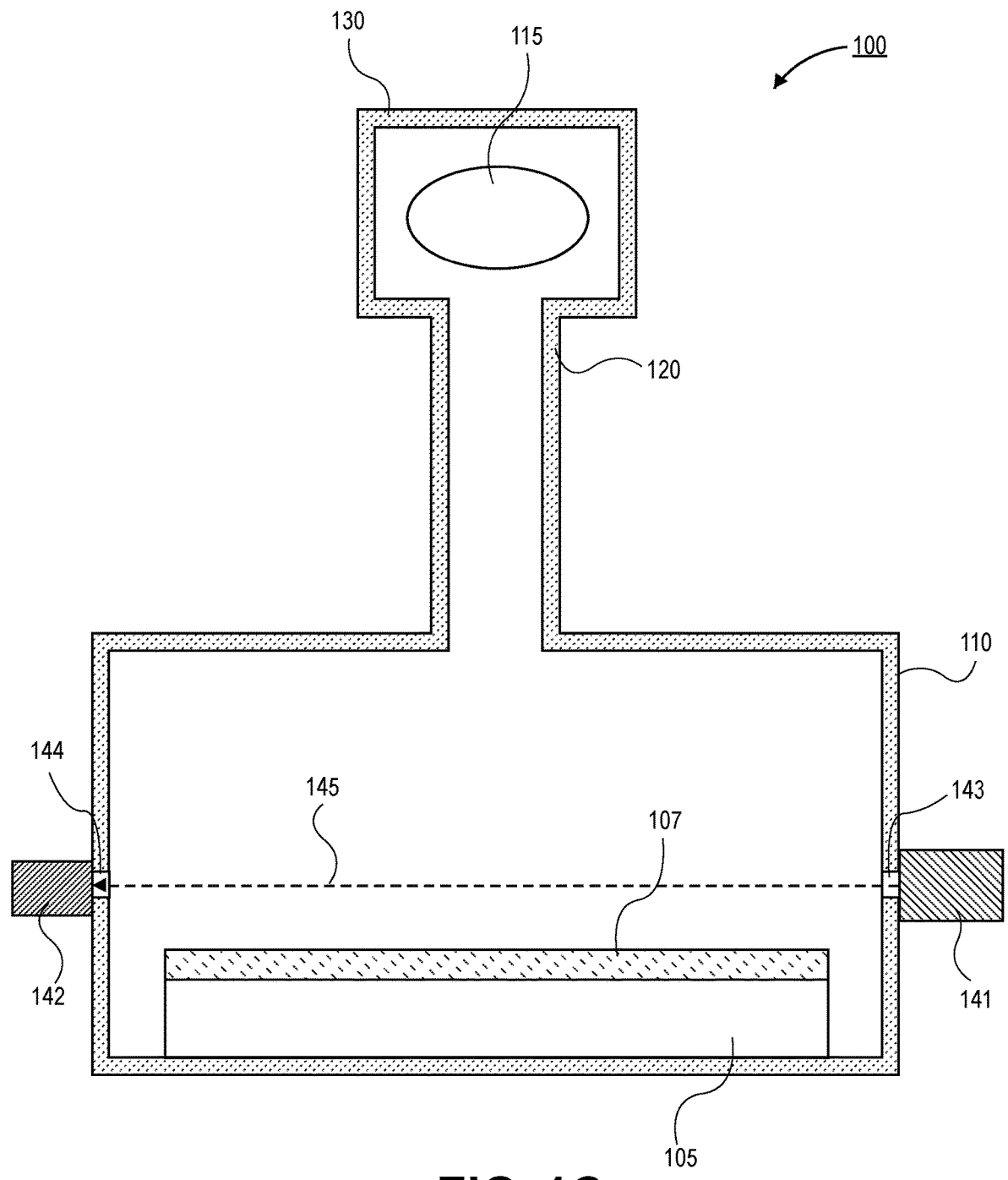
FIG. 1C is a cross-sectional illustration of a plasma processing tool with an RPS that includes a laser source and a detector provided on the main processing chamber above the substrate, in accordance with an embodiment.

Referring now to FIG. 1C a cross-sectional illustration of a semiconductor processing tool 100 is shown, in accordance with an additional embodiment. The semiconductor processing tool 100 may include any type of plasma processing tool. For example, the semiconductor processing tool 100 may be a plasma etching or a plasma deposition chamber. The semiconductor processing tool 100 may be a standalone tool, or the semiconductor processing tool 100 may be part of a cluster tool.

In the illustrated embodiment, the semiconductor processing tool 100 is shown as being an RPS tool. The RPS semiconductor processing tool 100 may include a plasma chamber 130, a pipe 120, and a main processing chamber processing chamber 110.

The plasma chamber 130 is shown as a featureless chamber for simplicity. However, it is to be appreciated that the plasma chamber 130 may comprise a lid or showerhead through which gasses are flown into the chamber. The lid may also act as an RF or microwave source in order to strike the plasma within the plasma chamber 130. In an embodiment, a volume of the plasma chamber 130 is smaller than a volume of the main processing chamber 110.

In an embodiment, the main processing chamber 110 may include a pedestal 105. In an embodiment, the pedestal 105 may include a chucking architecture, such as an ESC architecture. The pedestal 105 may also comprise thermal control (e.g., heating or cooling) structures in order to control a temperature of the substrate 107 that is secured by the pedestal 105. In an embodiment, the substrate 107 may be any substrate suitable for semiconductor processing operations. For example, the substrate 107 may be a semiconductor wafer, such as a silicon wafer, though other substrate materials may also be used. An exhaust (not shown) may also be provided in the main processing chamber 110.

In an embodiment, the laser absorption spectroscopy tool may include a laser source 141 and a detector 142. The laser source 141 may be coupled over a first window 143 through the sidewall of the main processing chamber 110, and the detector 142 may be coupled over a second window 144 through the sidewall of the main processing chamber 110. In an embodiment, the laser source 141 and the detector 142 may be relatively close to the substrate 107. For example, the laser 145 may be approximately 10 mm or less away from the substrate 107. In a particular embodiment, the laser 145 may be approximately 5 mm or less away from the substrate 107. Such an embodiment may result in the measured species concentration being closer to the species concentration that actually interacts with the substrate 107.

In an embodiment, a laser 145 propagated by the laser source 141 passes through a volume of the main processing chamber 110 and is optically coupled to the detector 142. In an embodiment, the laser source 141 may be any suitable wavelength laser suitable for laser absorption spectroscopy. For example a 1278 nm laser source 141 may be used, in accordance with an embodiment. The detector 142 may be any type of optical detector. For example, the detector 142 may be a CCD device.

Figure 2:
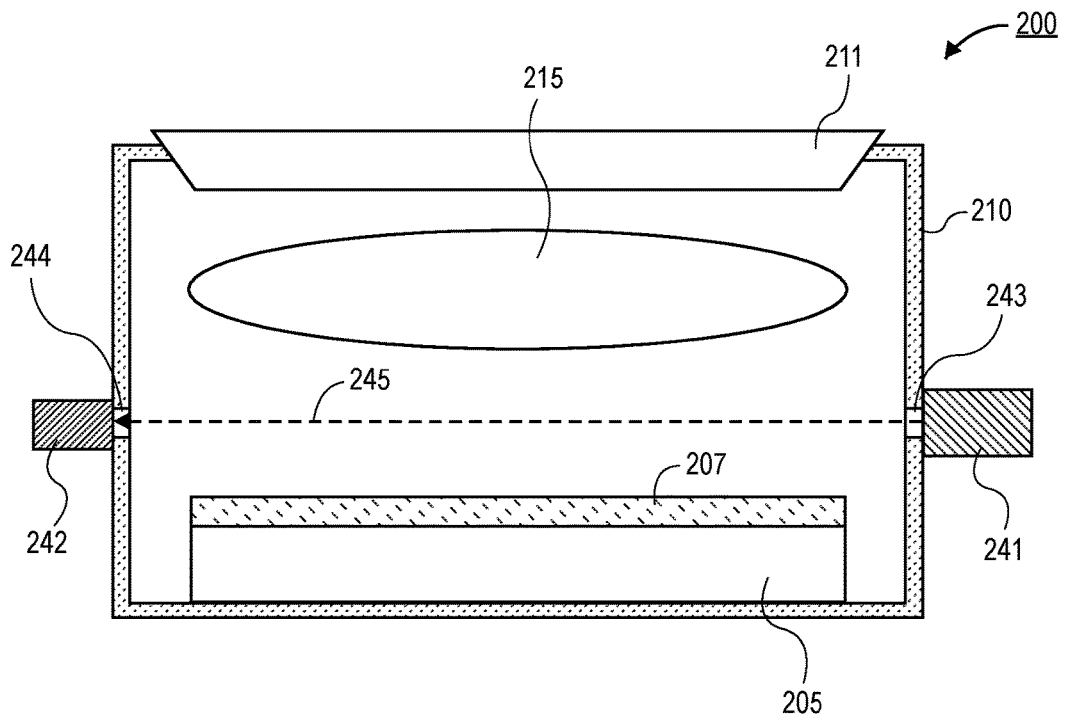
FIG. 2 is a cross-sectional illustration of a plasma processing tool that includes a laser source and a detector on the main processing chamber above the substrate, in accordance with an embodiment.

Referring now to FIG. 2, a cross-sectional illustration of a semiconductor processing tool 200 is shown, in accordance with an embodiment. In an embodiment, the semiconductor processing tool 200 may be any plasma chamber, such as a plasma etching chamber or a plasma deposition chamber. In contrast to the RPS embodiments, described above, the semiconductor processing tool 200 may be a standard plasma tool, in accordance with an embodiment. That is, the plasma 215 is generated in the same volume as the substrate 207.

The plasma 215 may be struck using an RF or microwave source that is coupled to a lid 211 of the chamber 210. The lid 211 may comprise conductive features that couples a microwave or RF signal to processing gasses within the chamber 210 in order to strike the plasma 215. In an embodiment, the lid 211 may also be a gas showerhead. That is, gasses (e.g., processing gasses, inert gasses, etc.) may be flown into the chamber 210 through the lid 211. The gas channels through the lid 211 are omitted for simplicity.

Additionally, the gas may also be flown into the chamber 210 through a surface other than the lid 211 in some embodiments.

In an embodiment, a pedestal 205 may be provided in the chamber 210. In an embodiment, the pedestal 205 may include a chucking architecture, such as an ESC architecture. The pedestal 205 may also comprise thermal control (e.g., heating or cooling) structures in order to control a temperature of the substrate 207 that is secured by the pedestal 205. In an embodiment, the substrate 207 may be any substrate suitable for semiconductor processing operations. For example, the substrate 207 may be a semiconductor wafer, such as a silicon wafer, though other substrate materials may also be used. An exhaust (not shown) may also be provided in the processing chamber 210.

In an embodiment, the laser absorption spectroscopy tool may include a laser source 241 and a detector 242. The laser source 241 may be coupled over a first window 243 through the sidewall of the processing chamber 210, and the detector 242 may be coupled over a second window 244 through the sidewall of the processing chamber 210. In an embodiment, the laser source 241 and the detector 242 may be relatively close to the substrate 207. For example, the laser 245 may be approximately 10 mm or less away from the substrate 207. In a particular embodiment, the laser 245 may be approximately 5 mm or less away from the substrate 207. Such an embodiment may result in the measured species concentration being closer to the species concentration that actually interacts with the substrate 207.

In an embodiment, a laser 245 propagated by the laser source 241 passes through a volume of the processing chamber 210 and is optically coupled to the detector 242. In an embodiment, the laser source 241 may be any suitable wavelength laser suitable for laser absorption spectroscopy. For example a 1278 nm laser source 241 may be used, in accordance with an embodiment. The detector 242 may be any type of optical detector. For example, the detector 242 may be a CCD.

Figure 3A:
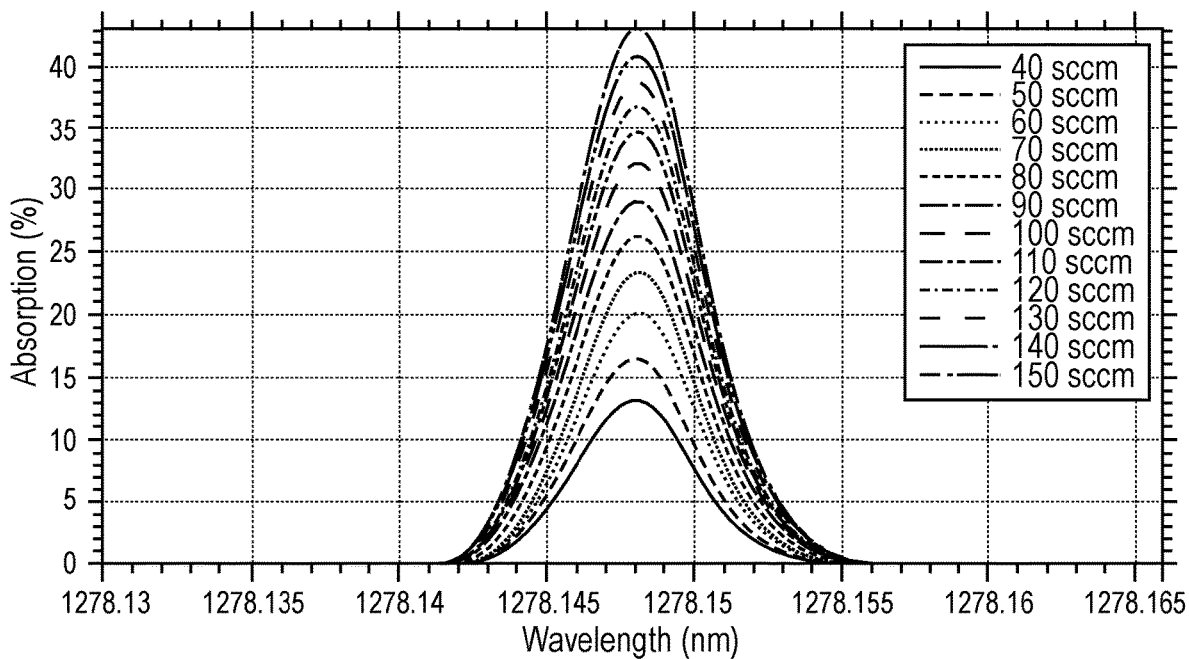
FIG. 3A is a graph of laser absorption for a plurality of gas flow rates, in accordance with an embodiment.
Figure 3B:
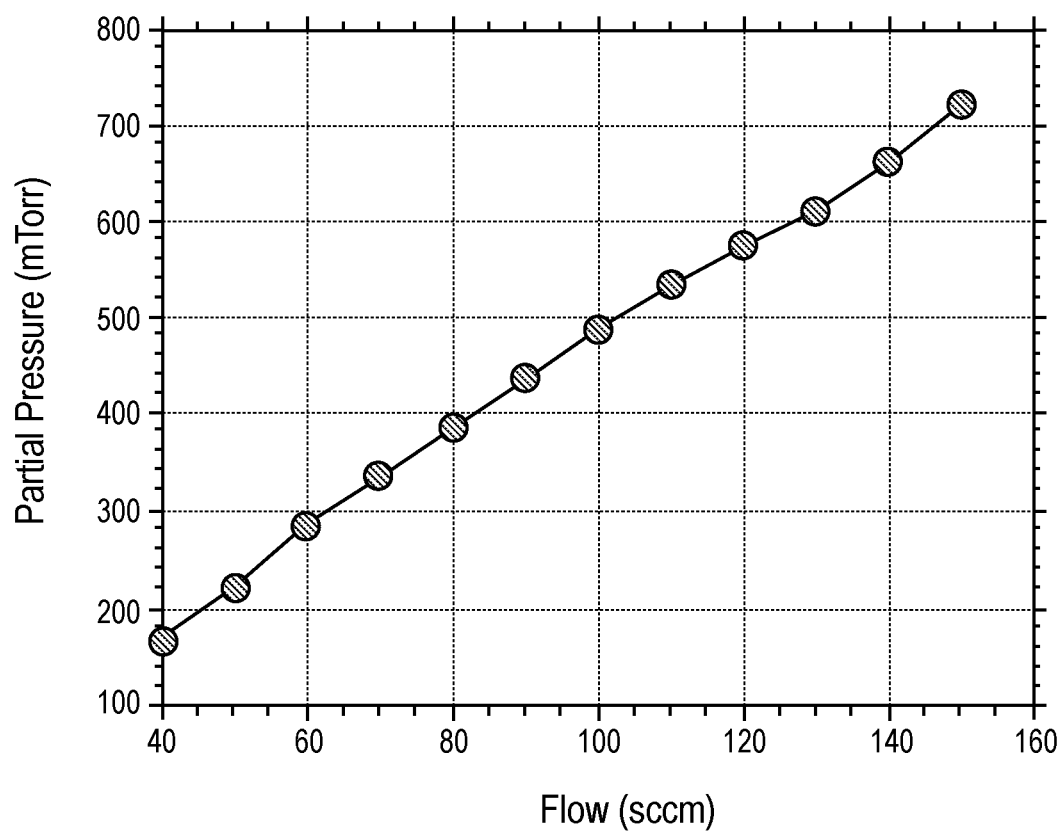
FIG. 3B is a graph of the species concentration relative to the gas flow rate, in accordance with an embodiment.

Referring now to FIG. 3A, a graph of laser absorption versus wavelength is illustrated, in accordance with an embodiment. In the illustrated graph, a plurality of different gas flow rates is shown. In an embodiment, the measured gas flow rates may be for one or more gasses that are flown into the chamber. For example, processing gasses may comprise $NF_3$. In an embodiment, the gas flow rates may range from 40 sccm to 150 sccm, though lower and higher gas flow rates may also be used. As shown, higher gas flow rates correspond with higher absorption percentages. Referring now to FIG. 3B, a graph of the species concentration (i.e., partial pressure) is shown relative to the gas flow rate, in accordance with an embodiment. In the particular instance of an $NF_3$ gas, the partial pressure may be of HF species. As shown, higher gas flow rates correspond to higher species concentrations. With the combination of the graphs in FIGS. 3A and 3B, the laser absorption percentage can be used in order to calculate the species concentration in a given process.

Figure 4A:
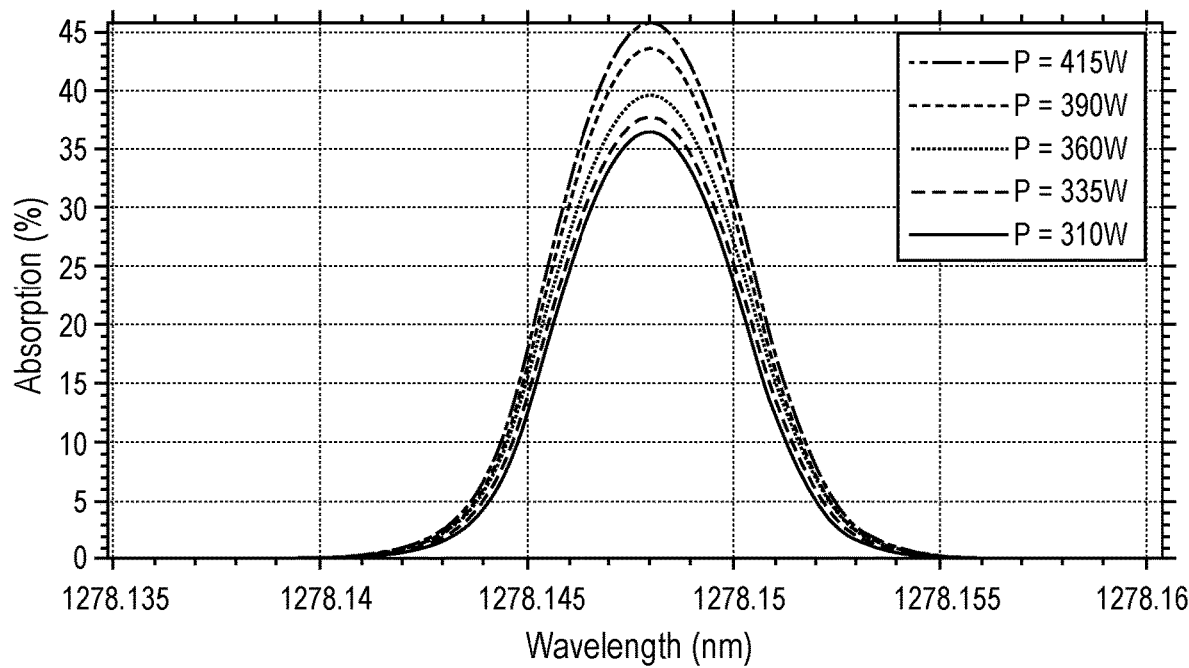
FIG. 4A is a graph of laser absorption for a plurality of plasma power values, in accordance with an embodiment.
Figure 4B:
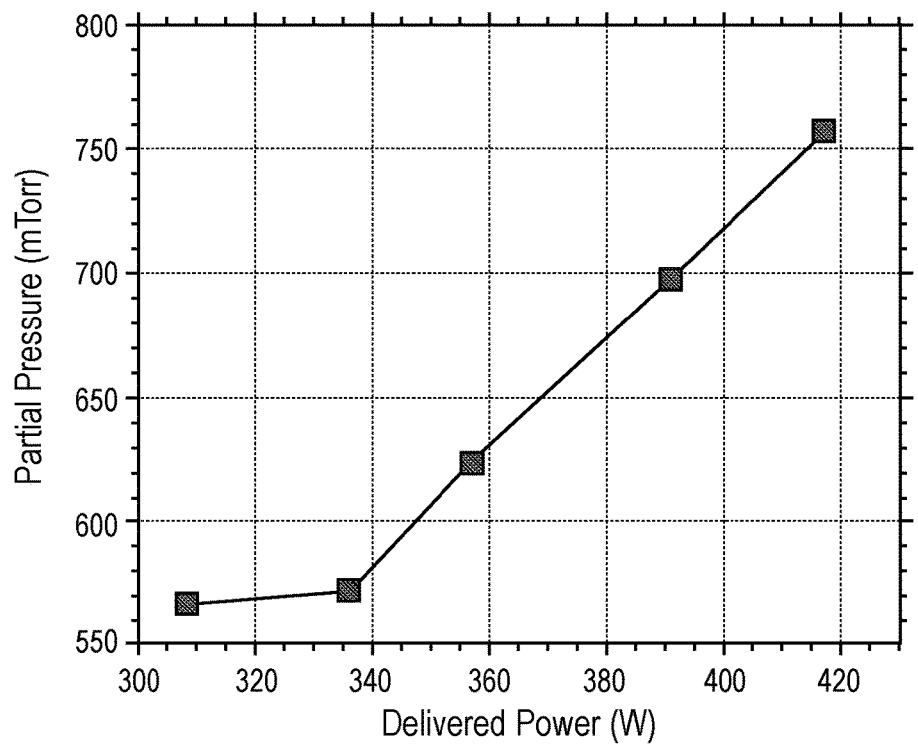
FIG. 4B is a graph of the species concentration relative to delivered power, in accordance with an embodiment.

Referring now to FIG. 4A, a graph of laser absorption versus wavelength is illustrated, in accordance with an embodiment. In the illustrated graph, a plurality of different power delivery levels is shown. In an embodiment, the power delivery may refer to the power that is delivered to the plasma in the chamber. In an embodiment, the delivered power may range from 310 W to 415 W, though lower and higher powers may also be used. As shown, a higher delivered power corresponds with a higher absorption percentage. Referring now to FIG. 4B, a graph of the species concentration (i.e., partial pressure) is shown relative to the delivered power, in accordance with an embodiment. As shown, higher delivered power corresponds to higher species concentrations. With the combination of the graphs in FIGS. 4A and 4B, the laser absorption percentage can be used in order to calculate the species concentration in a given process.

In FIGS. 3A-4B, examples of gas flow rate and delivered power are used in order to illustrate how laser absorption spectroscopy can be used to determine species concentrations. However, it is to be appreciated that other plasma parameters may also be used in order to alter the species concentration measured by the laser absorption spectroscopy tool. For example, a frequency of the plasma, a pressure in the processing chamber, and a temperature of the processing chamber, can also be changed in order to alter the concentration of species in the chamber. Furthermore, while an example of HF is provided as the measured species concentration, it is to be appreciated that other species or combination of species may also be monitored. For example, concentrations of one or more of HF, O, Ar, N, NH, $NH_2$, $NH_3$, F, He, H, $H_2$, $F_2$, NF, $NF_2$, $NF_3$, Cl, HCl, CH, CH2, CH3, CH4, C2H2, C, H2O, OH, H2S, HS, PH, PH2, PH3, P, SiH, SiH2, SiH3, SiH4, and Si can be monitored by the laser absorption spectroscopy.

Figure 5:
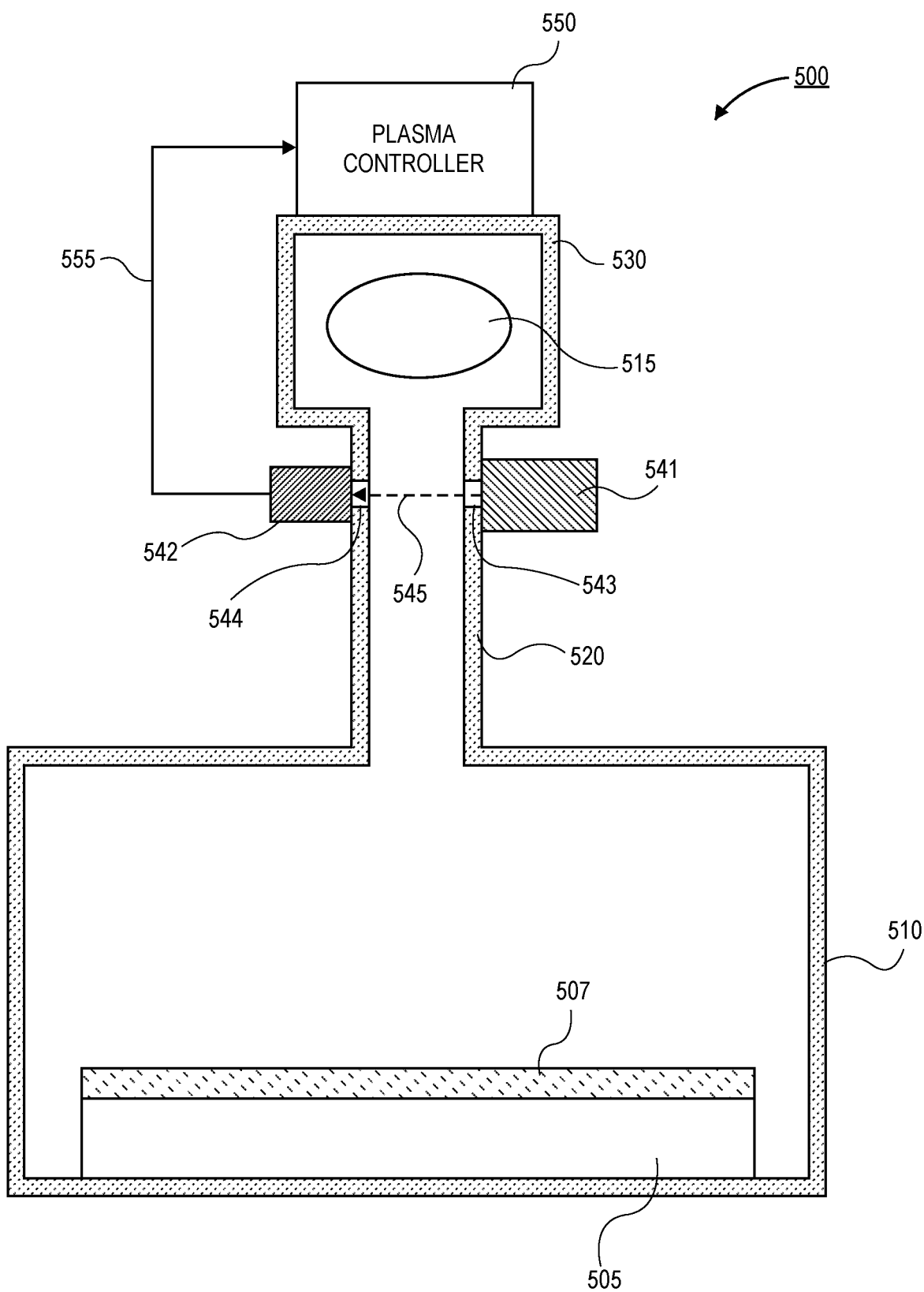
FIG. 5 is a cross-sectional illustration of a plasma processing tool that comprises a laser and a detector, where the detector is coupled to a plasma controller in order to provide closed-loop control of the plasma in the chamber, in accordance with an embodiment.

Referring now to FIG. 5, a cross-sectional illustration of a semiconductor processing tool 500 is shown, in accordance with an embodiment. In an embodiment, the semiconductor processing tool 500 may be substantially similar to the semiconductor processing tool 100 illustrated in FIG. 1A. For example, a plasma chamber 530 may be fluidically coupled to a main processing chamber 510 by a pipe 520. The main processing chamber 510 may include a pedestal 505 and a substrate 507 on the pedestal 505. In an embodiment, a plasma 515 may be struck in the plasma chamber 530. Additionally, a laser absorption spectroscopy tool including a laser source 541 and a detector 542 may be included. The laser source 541 and the detector 542 may be optically coupled to each other through windows 543 and 544 in the pipe 520. A laser 545 may pass between the windows 543 and 544 from the laser source 541 to the detector 542.

In FIG. 5, a feedback loop 555 is also included. The feedback loop 555 may loop back to a plasma controller 550. The plasma controller 550 may be used to control one or more parameters of the plasma generation in the plasma chamber 530. For example, the plasma controller 550 may control gas flow rates, delivered power to the plasma, a frequency of the plasma, a pressure in the plasma chamber 530, and a temperature of the plasma chamber 530. The feedback loop 555 may provide a closed-loop control solution in order to monitor and control the species concentration within the semiconductor processing tool. As such, control of the processing conditions may be enabled without the need for relying on historical data and/or dummy substrates.

Figure 6:
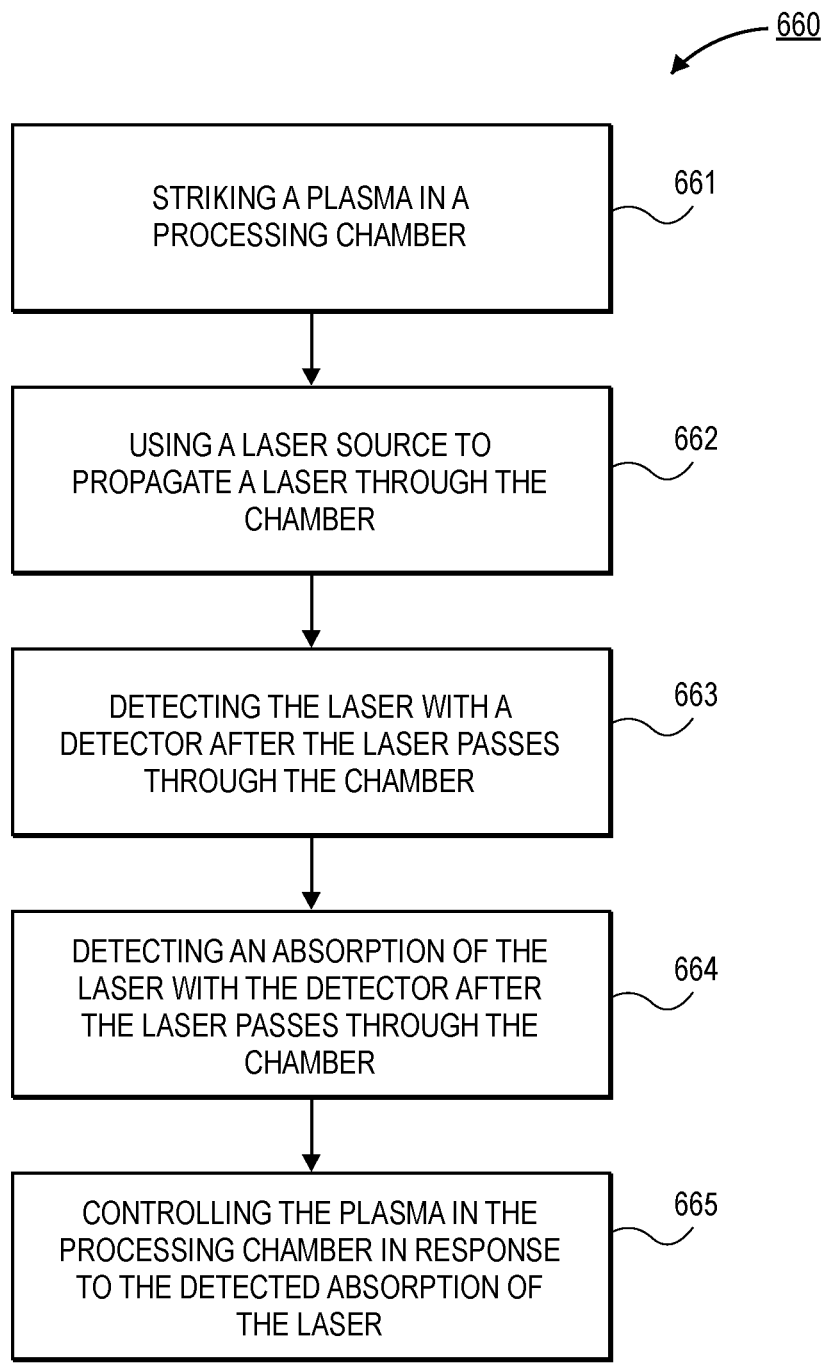
FIG. 6 is a process flow diagram of a process for controlling a plasma in a plasma processing tool using closed-loop control that is informed by laser absorption spectroscopy, in accordance with an embodiment.

Referring now to FIG. 6, a process flow diagram of a process 660 is shown, in accordance with an embodiment. In an embodiment, the process 660 may be used in order to control the species concentration within a semiconductor processing chamber.

In an embodiment, the process 660 may begin with operation 661, which comprises striking a plasma in a processing chamber. In an embodiment, the processing chamber may be similar to any of the processing chambers described in greater detail herein. For example, the processing chamber may be an RPS chamber or a standard plasma chamber.

In an embodiment, the process 660 may continue with operation 662, which comprises using a laser source to propagate a laser through the chamber. The laser source may be any suitable wavelength for laser absorption spectroscopy and may even include multiple wavelengths in some embodiments. As the laser passes through the chamber, the laser interacts with species and power from the laser is absorbed.

In an embodiment, the process 660 may continue with operation 663, which comprises detecting the laser with a detector after the laser passes through the chamber. In an embodiment, the detector may be a CCD or any other optical detector architecture. In an embodiment, the detector may be opposite from the laser source. As such, the laser can propagate in a direct line across the chamber from the laser source to the detector. The laser source and the detector may be outside windows through sidewalls of the chamber.

In an embodiment, the process 660 may continue with operation 664, which comprises detecting an absorption of the laser with the detector after the laser passes through the chamber. In an embodiment, the amount of absorption of the laser may be correlated with a species density in the chamber.

In an embodiment, the process 660 may continue with operation 665, which comprises controlling the plasma in the processing chamber in response to the detected absorption of the laser. For example, the feedback from the laser absorption may be used to change one or more plasma parameters, such as, for example, a gas flow rate, a delivered power to the plasma, a frequency of the plasma, a pressure in the processing chamber, and a temperature of a the processing chamber.

As noted above, not all radical species or other species can be directly measured with laser absorption spectroscopy processes. Accordingly, embodiments disclosed herein further include a measurement line that is capable of converting the radicals (or species) into a species that is capable of being measured by the laser absorption spectroscopy process. In some embodiments, the measurement line is fluidically in parallel with the main processing chamber. In other embodiments, the measurement line may be directly coupled to the main processing chamber. In yet another embodiment, the measurement line is downstream of the main processing chamber. In an embodiment, the measurement line may include a reaction chamber and a measurement chamber. In other embodiments, the reaction chamber and the measurement chamber may be combined into a single structure.

Figure 7A:
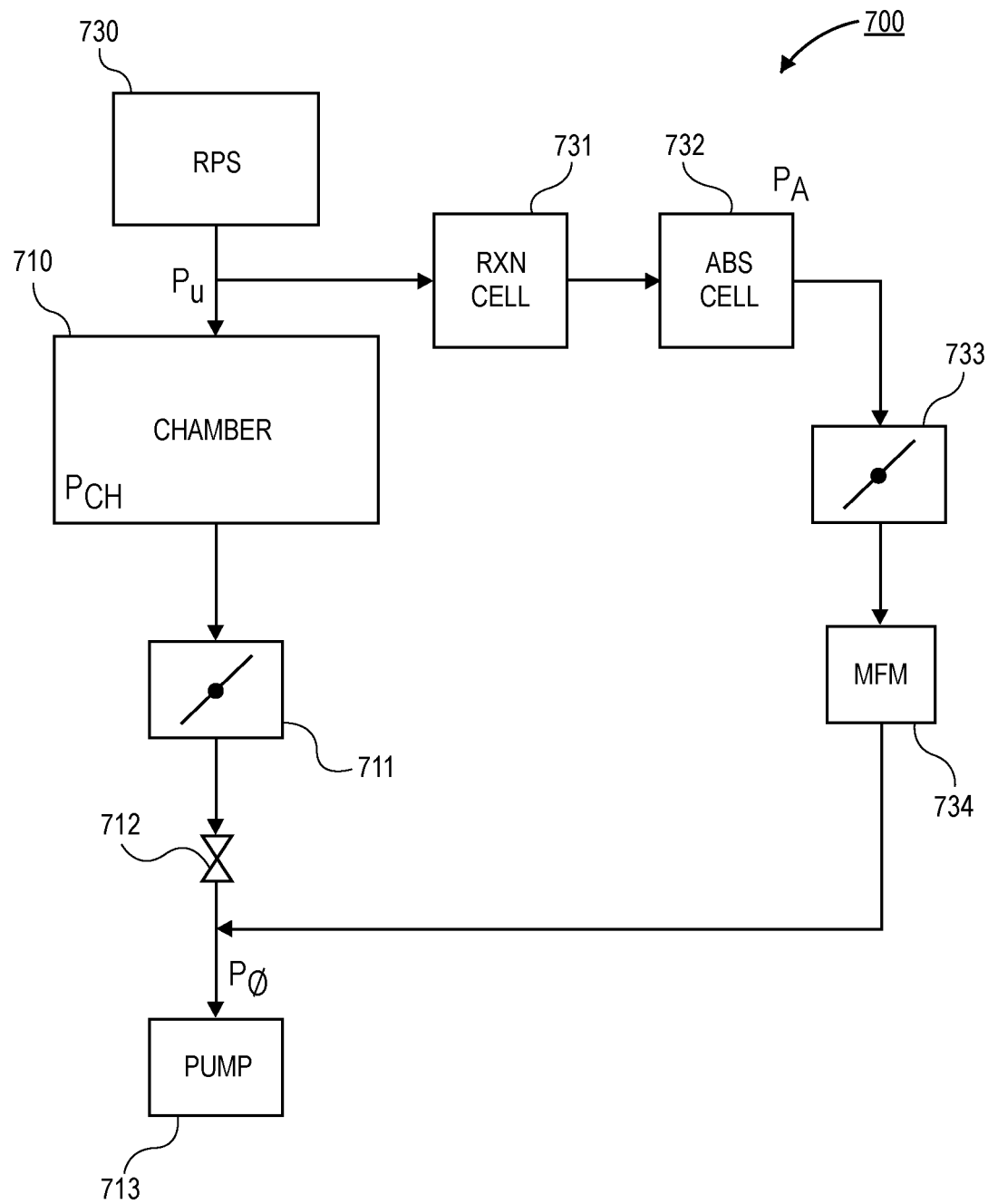
FIG. 7A is a schematic illustration of a plasma processing tool with a radical concentration measurement line, in accordance with an embodiment.

Referring now to FIG. 7A, a schematic illustration of a semiconductor processing tool 700 is shown, in accordance with an embodiment. In an embodiment, the semiconductor processing tool 700 may include a remote plasma source 730. While embodiments with a remote plasma source 730 are shown, it is to be appreciated that any device capable of producing radicals may be used in place of the remote plasma source 730.

In an embodiment, the remote plasma source 730 may be fluidically coupled to a main processing chamber 710. The main processing chamber 710 may include a chuck or the like for securing a substrate (not shown). The main processing chamber may be used as a deposition chamber, an etching chamber, or any other chamber for semiconductor processing that includes a radical species.

In an embodiment, the main processing chamber 710 may be fluidically coupled to a pump 713. The pump 713 provides a low pressure environment (e.g., a vacuum environment) for the main processing chamber 710. A chamber throttle valve 711 and a chamber isolation valve 712 may be provided between the pump 713 and the chamber 710, as is common in semiconductor manufacturing tools.

In an embodiment, a pressure $P_U$ may be provided between the remote plasma source 730 and the main chamber 710. A chamber pressure $P_{CH}$ may be provided in the chamber 710, and a pump pressure $P_\emptyset$ may be provided at the pump 713. In an embodiment, pressure $P_U$ is greater than pressure $P_{CH}$, and pressure $P_{CH}$ is greater than pressure $P_\emptyset$.

In an embodiment, a measurement line may be provided in fluidic parallel to the chamber 710. That is, an entrance to the measurement line may be upstream of the chamber 710, and an exit of the measurement line may be downstream of the chamber 710. For example, the entrance to the measurement line may be provided between the remote plasma source 730 and the chamber 730, and the exit of the measurement line may be provided between the isolation valve 712 and the pump 713.

In an embodiment, the measurement line is configured to modify the radicals (or species) generated by the remote plasma source 730 so that the radicals (or species) are compatible with laser absorption spectroscopy. For example, a controlled chemical reaction with the radicals (or species) may be implemented in order to generate a new species that is able to be detected by laser absorption spectroscopy. The measurement of the new species can then be used in order to calculate the concentration or flux of the original radicals (or species).

In an embodiment, the measurement line may include a reaction cell 731. The reaction cell 731 may be a chamber where the radicals are reacted to form a new species. As such, the reaction cell 731 may be referred to as a reaction chamber 731 in some instances. In an embodiment, the reaction cell 731 may receive the radicals as a first input, and the reaction cell 731 may receive a first gas as a second input. The radicals and the first gas may react with each other in order to form a second gas. The second gas comprises species that are measureable with laser absorption spectroscopy. A more detailed description of reaction cell 731 is provided below.

In a particular embodiment, the radical or species of interest may be fluorine. In such an embodiment, the first gas may include one or more of $H_2$, $C_XH_YX_Z$ (where X is F or Cl), $C_XH_Y$, $NH_3$, $B_2H_6$, and $H_2O$. The reaction between F and the first gas may produce HF, which is measurable by laser absorption spectroscopy. In another embodiment, the radical or species of interest may be chlorine. In such an embodiment, the first gas may comprise one or more of $H_2$, $C_XH_YX_Z$ (where X is F or Cl), $C_XH_Y$, $NH_3$, $B_2H_6$, and $H_2O$. The reaction between Cl and the first gas may produce HCl, which is measureable by laser absorption spectroscopy. In another embodiment, the radical or species of interest may be oxygen. In such an embodiment, the first gas may comprise one or more of $C_XH_Y$, $H_2$, $NH_3$, or $B_2H_6$. The reaction between O and the first gas may produce one or more of CO, $CO_2$, and $H_2O$, which are measurable by laser absorption spectroscopy. In yet another embodiment, the radical or species of interest may be hydrogen. In such an embodiment, the first gas may comprise one or more of $NF_3$, $C_XF_YX_Z$ (where X is F or Cl), $Cl_2$, $F_2$, $SF_6$, $SiH_XF_{(4-X)}$, $SiH_XCl_{(4-X)}$, $GeH_XF_{(4-X)}$, and $GeH_XCl_{(4-X)}$. The reaction between H and the first gas may produce one or both of HF and HCl, which are measureable by laser absorption spectroscopy. The radicals may also include sulfur, phosphorus or silicon. OH, The reactions may also produce one or more of NH, NH$_2$, NH$_3$, HS, H$_2$S, PH, PH$_2$, PH$_3$, C$_x$H$_y$, SiH, SiH$_2$, SiH$_3$, and SiH$_4$ which are measureable by laser absorption spectroscopy. While several examples of material classes are shown, it is to be appreciated that any radical or species that can be reacted to form a new species that is measurable by laser absorption spectroscopy may be used in accordance with embodiments described herein.

In an embodiment, the measurement line may further include a measurement cell 732. The measurement cell 732 may be a chamber where the second gas is measured using laser absorption spectroscopy. As such, the measurement cell 732 may be referred to as a measurement chamber 732 or an absorption chamber 732 in some instances. In an embodiment, the measurement cell 732 may receive the second gas as an input. The second gas is then measured using laser absorption spectroscopy. For example, a pair of windows facing each other may allow for a laser to pass through the measurement cell 732 and be detected by a light detector. A more detailed description of measurement cell 732 is provided below.

In an embodiment, the measurement cell 732 may have a pressure $P_A$. In an embodiment, the pressure $P_A$ is less than the pressure $P_U$ and greater than the pressure $P_\emptyset$. The pressure $P_A$ may be controlled to be anywhere between $P_U$ and $P_\emptyset$ by controlling a throttle valve 733 downstream of the measurement cell 732. In an additional embodiment, a mass flow meter (MFM) 734 may be provided between the throttle valve 733 and the pump 713.

Figure 7B:
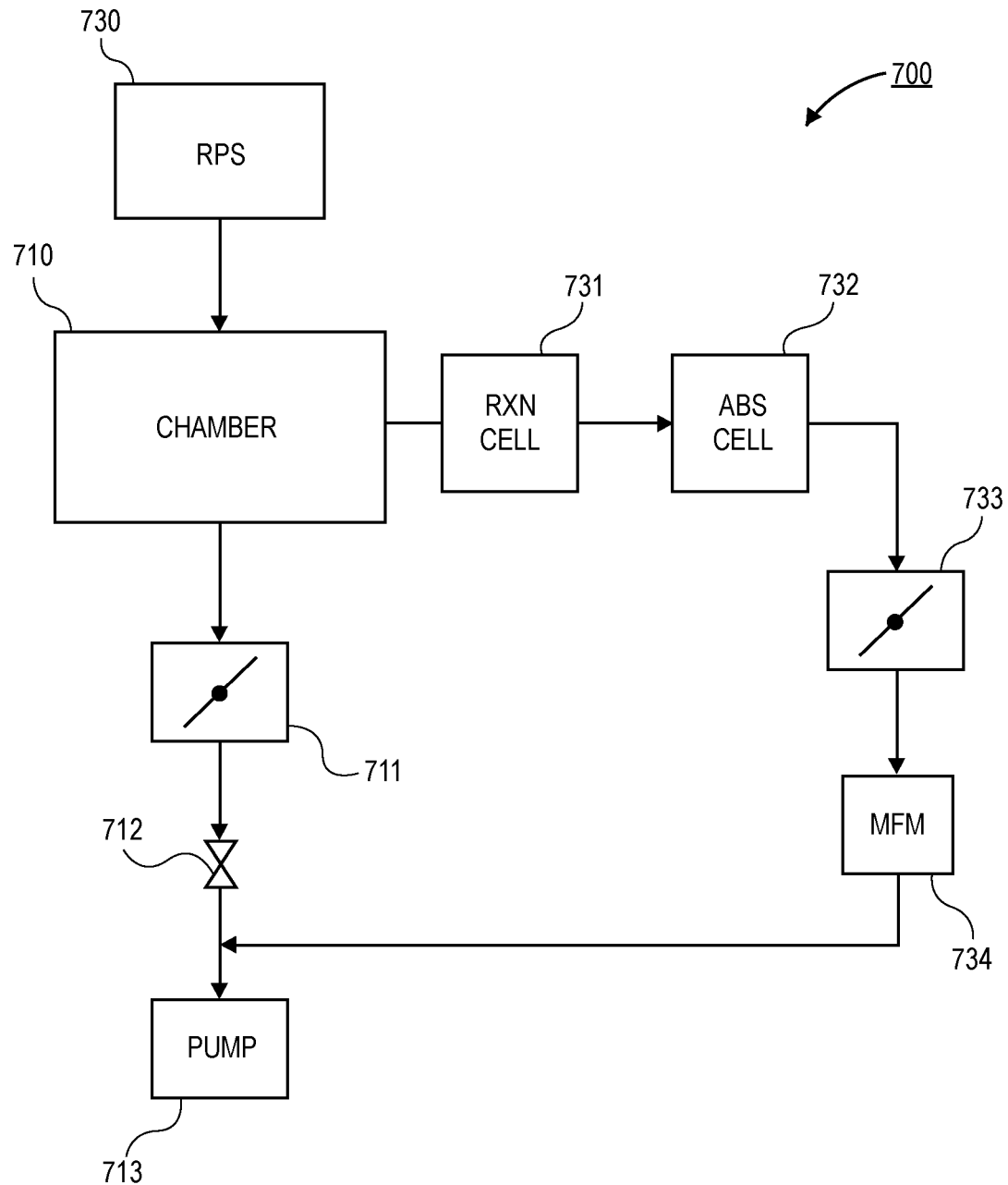
FIG. 7B is a schematic illustration of a plasma processing tool with a radical concentration measurement line, in accordance with an additional embodiment.

Referring now to FIG. 7B, a schematic illustration of a semiconductor processing tool 700 is shown, in accordance with an additional embodiment. The semiconductor processing tool 700 in FIG. 7B may be substantially similar to the semiconductor processing tool 700 in FIG. 7A, with the exception of the fluidic coupling of the measurement line. Instead of being fluidically in parallel with the main processing chamber 710, the upstream side of the measurement line is coupled to the chamber 710. As such, flux of radicals that enter the chamber may be determined by the measurement line. In the illustrated embodiment, a remote plasma source 730 is shown. However, it is to be appreciated that a plasma source that is integrated with the main processing chamber 710 may also be used. The measurement line may have a downstream end that couples to a gas line between the isolation valve 712 and the pump 713.

Figure 7C:
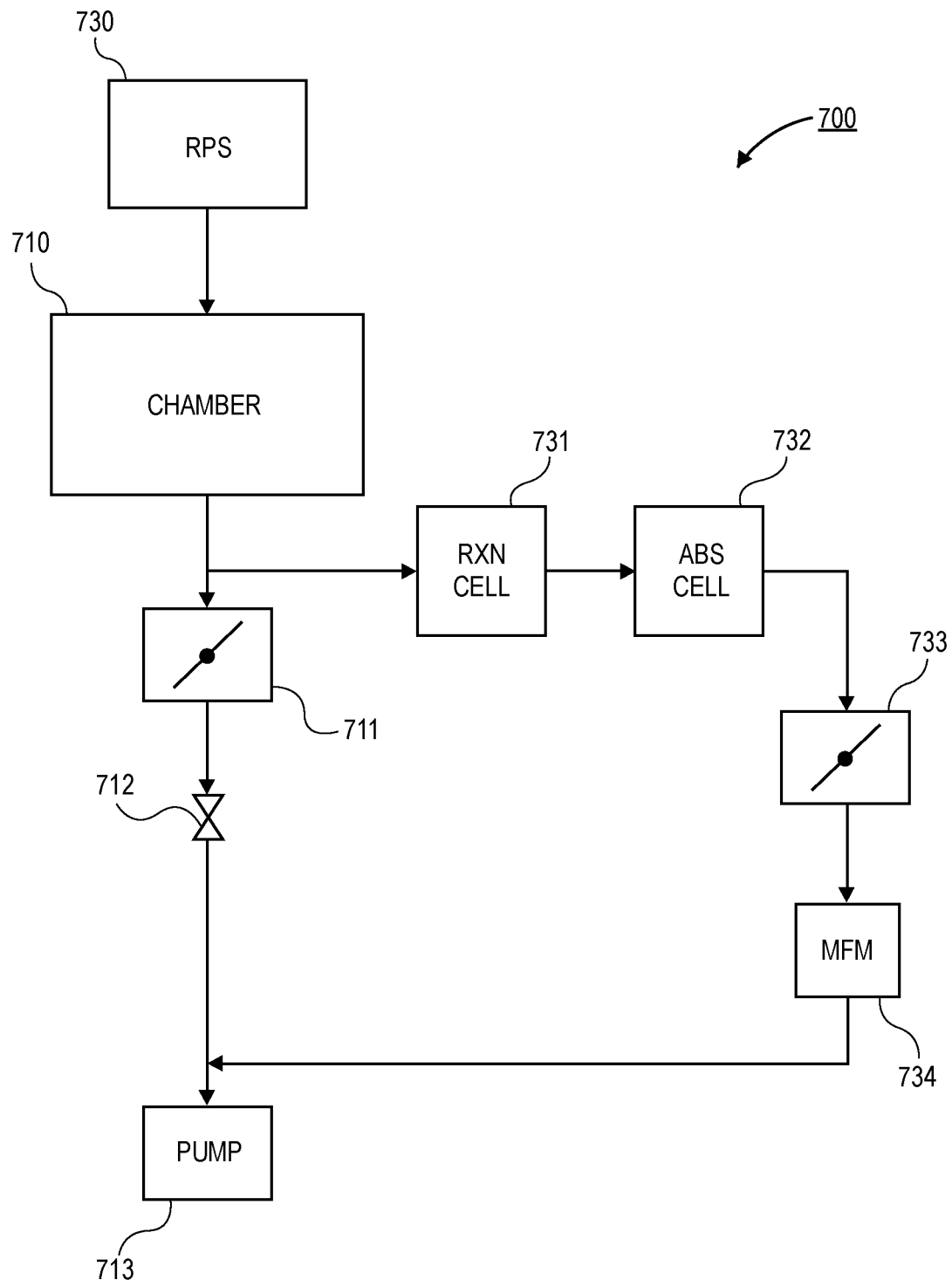
FIG. 7C is a schematic illustration of a plasma processing tool with a radical concentration measurement line, in accordance with an additional embodiment.

Referring now to FIG. 7C, a schematic illustration of a semiconductor processing tool 700 is shown, in accordance with an additional embodiment. In an embodiment, the semiconductor processing tool 700 in FIG. 7C may be substantially similar to the semiconductor processing tool 700 in FIG. 7A, with the exception of the fluidic coupling of the measurement line. Instead of being fluidically in parallel with the main processing chamber 710, the upstream side of the measurement line is coupled to a gas line between the main chamber 710 and the throttle valve 711. As such, flux of radicals that exit the chamber may be determined by the measurement line. In the illustrated embodiment, a remote plasma source 730 is shown. However, it is to be appreciated that a plasma source that is integrated with the main processing chamber 710 may also be used. The measurement line may have a downstream end that couples to a gas line between the isolation valve 712 and the pump 713.

In FIGS. 7A-7C, three different measurement line architectures are shown. However, it is to be appreciated that the three different measurement line architectures may be combined with each other in some embodiments. For example, two or more different measurement lines may be provided in a single semiconductor processing tool 700. That is, a single semiconductor processing tool 700 may include a first measurement line with an input between the plasma source and the main chamber, a second measurement line with an input at the main chamber, and a third measurement line with an input downstream of the main chamber.

Figure 8A:
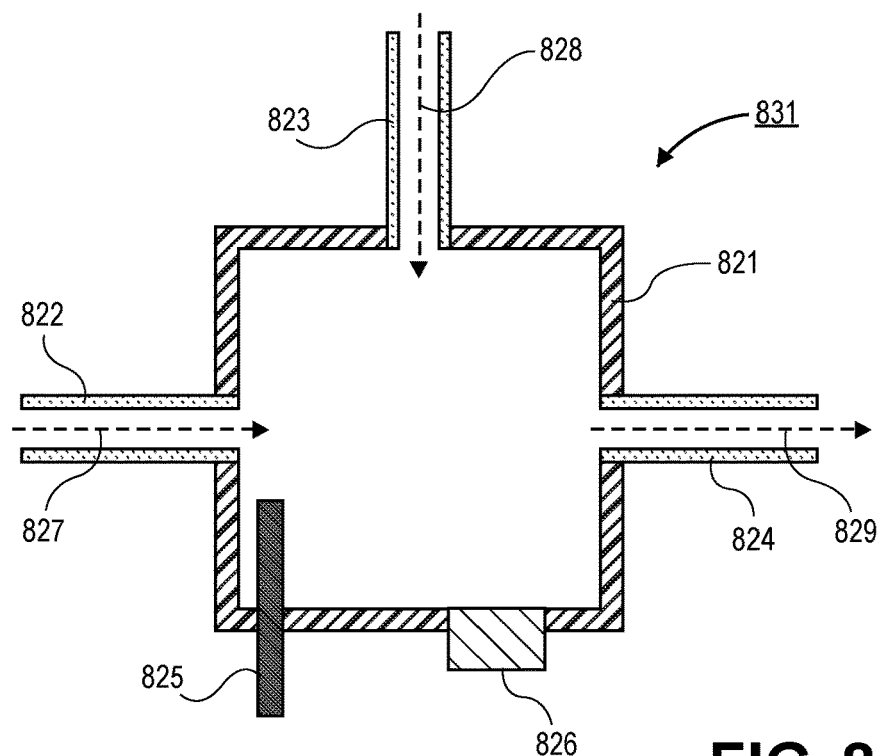
FIG. 8A is a cross-sectional illustration of a reaction chamber on the radical concentration measurement line, in accordance with an embodiment.

Referring now to FIG. 8A, a cross-sectional illustration of a reaction cell 831 that may be used in a semiconductor processing tool is shown, in accordance with an embodiment. In an embodiment, the reaction cell 831 may include a chamber 821. The chamber may be fluidically coupled to a main processing line of a plasma processing tool. For example, the reaction cell 831 may be fluidically coupled between a remote plasma source and a main chamber, fluidically coupled to the main chamber, or fluidically coupled on the downstream side of the main chamber, similar to embodiments shown in FIGS. 7A-7C.

In an embodiment, the chamber 821 may have a plurality of gas feed lines. Feed line 822 may be used to route radicals 827 from the remote plasma source (or other source of radicals or species) into the chamber 821. In an embodiment, a second feed line 823 is used to route a first gas 828 into the chamber 821. The flow of the first gas 828 may be controlled by a mass flow controller (not shown). As such, a specific quantity of the first gas 828 can be flown into the chamber 821 in order to react with the species 827 to form a second gas 829. In an embodiment, a third feed line 824 may serve as an exit from the chamber 821. The second gas 829 may exit the chamber 821 through the third feed line 824. In an embodiment, the second gas 829 may include the species that is to be measured. Additional embodiments have a second gas 829 that includes other species that are part of the reaction between the radicals and the first gas, but which are not targeted to be measured.

In an embodiment, the chamber 821 may also include a thermometer 825 or any other device capable of measuring temperature. The thermometer 825 may be used to control a temperature of the chamber 821. For example, the chamber 821 may be heated or cooled in order to drive certain reactions. Additionally, the chamber 821 may include a transducer 826. The transducer 826 may be used in conjunction with a throttle valve (e.g. throttle valve 733 in FIG. 7A) in order to control the pressure within the chamber 821.

Figure 8B:
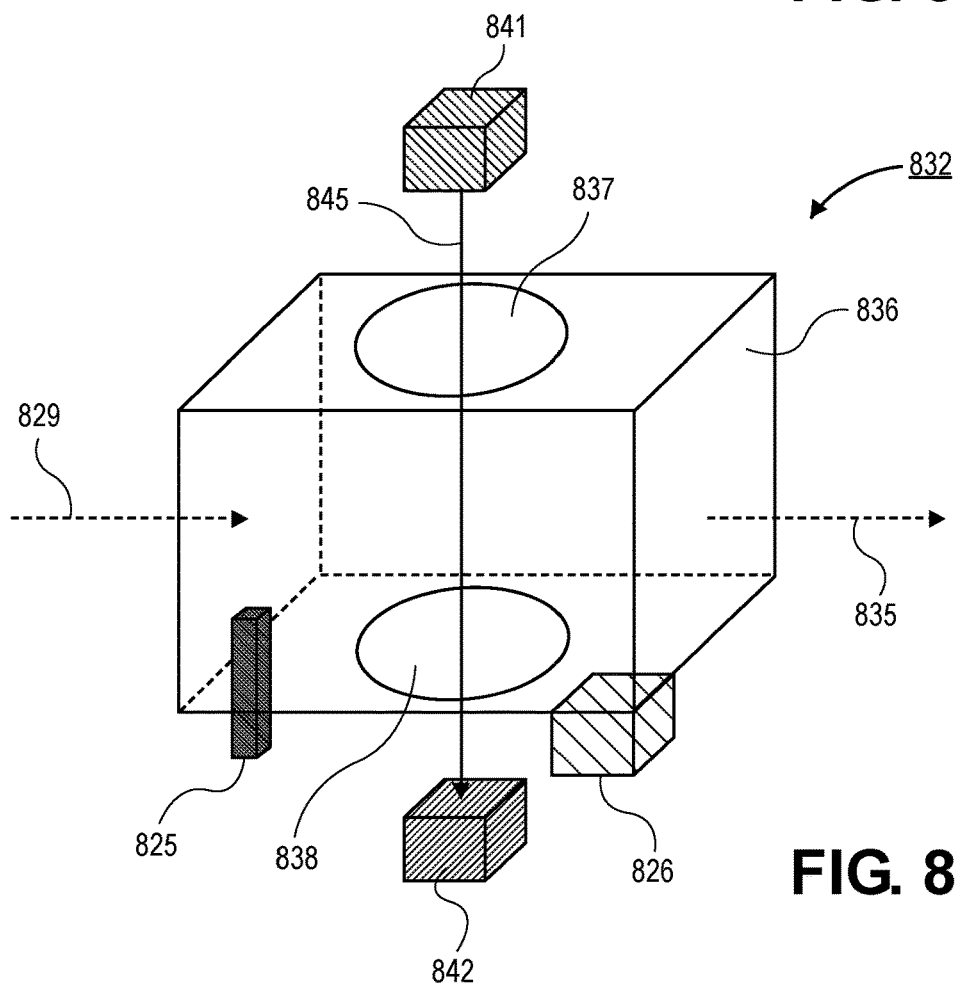
FIG. 8B is an illustration of a measurement chamber on the radical concentration measurement line, in accordance with an embodiment.

Referring now to FIG. 8B, an illustration of the measurement cell 832 is shown, in accordance with an embodiment. In an embodiment, the measurement cell 832 may include a chamber 836. The chamber 836 may be fluidically coupled to the chamber 821 through the third feed line 824. As such, the second gas 829 is flown into the chamber 836. The second gas 829 flows through the chamber 836 and exits as gas 835. In an embodiment, gas 835 may be substantially similar to the second gas 829. That is, there may not be any further reactions in the chamber 836.

In an embodiment, the measurement cell 832 may further comprise a pair of windows 837 and 838. The windows 837 and 838 may be on opposite sides of the chamber 836. A light source 841 (e.g., a laser) may be provided adjacent to the window 837, and a light detector 842 may be provided adjacent to the window 838. The light source 841 is configured to emit light 845 that passes through the windows 837 and 838, and the light source 841 is optically coupled with the light detector 842. The light 845 is absorbed in part by the second gas 829. The amount of absorption of the light 845 is detected by the light detector 842 in order to determine the concentration of the measured species. The concentration of the measured species can then be used to calculate the concentration or flux of the radical species flown into the measurement line.

In an embodiment, the chamber 836 may also include a thermometer 825 or any other device capable of measuring temperature. The thermometer 825 may be used to control a temperature of the chamber 836. For example, the chamber 836 may be heated or cooled. Additionally, the chamber 836 may include a transducer 826. The transducer 826 may be used in conjunction with a throttle valve (e.g. throttle valve 733 in FIG. 7A) in order to control the pressure within the chamber 836.

Figure 9:
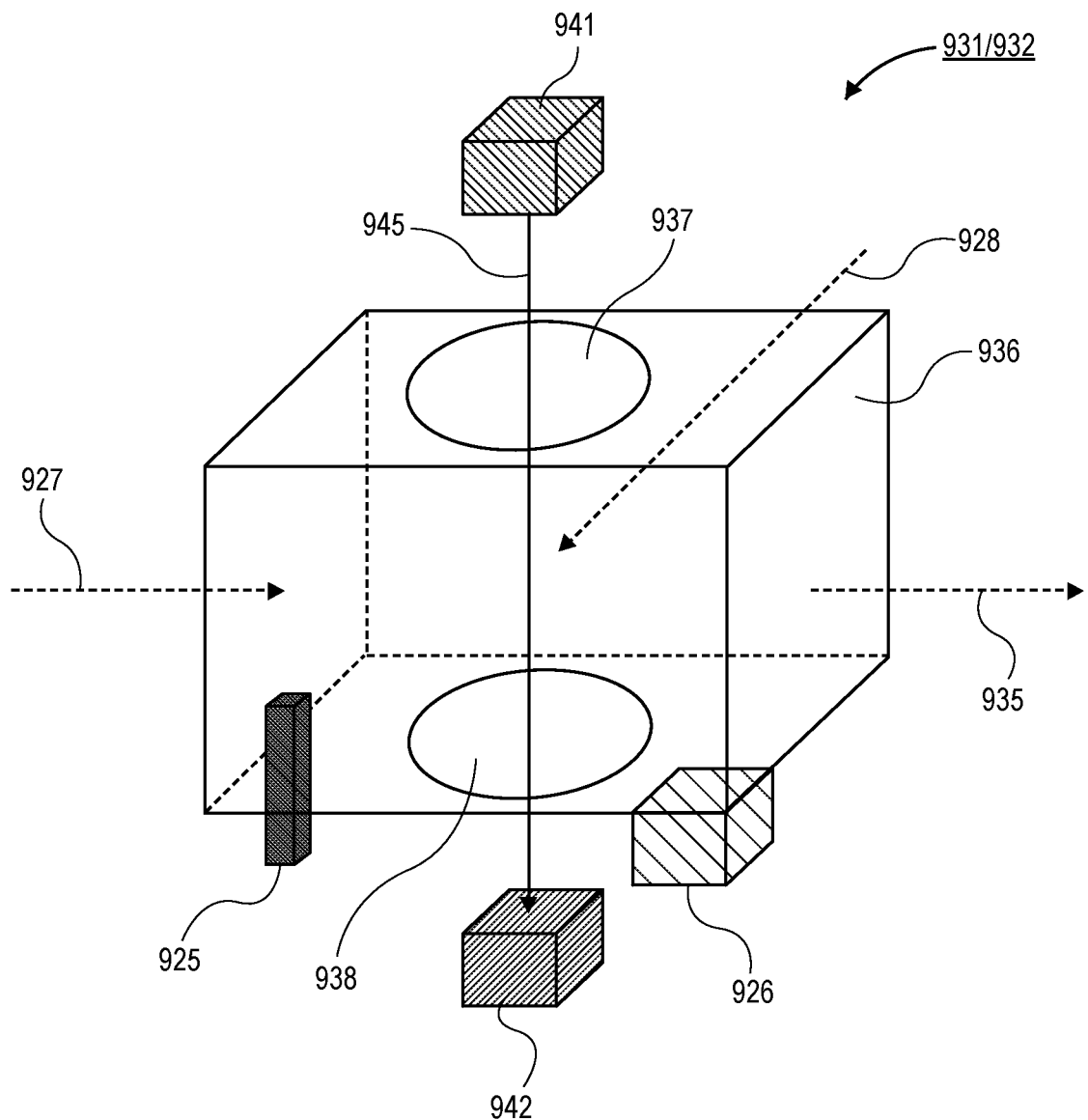
FIG. 9 is an illustration of a combination reaction chamber and measurement chamber on the radical concentration measurement line, in accordance with an embodiment.

Referring now to FIG. 9, an illustration of a combination reaction cell 931 and measurement cell 932 is shown, in accordance with an embodiment. That is, instead of having different chambers (as shown in FIGS. 8A and 8B), the cell 931/932 may include a single chamber 936. As such, the chemical reaction (to convert the radical species into a measurable species) and the absorption measurement may be provided in the same chamber 936.

In an embodiment, the radical species 927 may be flown into the chamber 936. In an embodiment, the first gas 928 is also flown into the chamber 936. The amount of the first gas 928 that is flown into the chamber 936 may be controlled by a mass flow controller (not shown). The first gas 928 and the radical species 927 may react to form a second gas 935 that flows out of the chamber 936.

Additionally, the laser absorption spectroscopy architecture is provided on the chamber 936. For example, a pair of windows 937 and 938 may be on opposite sides of the chamber 936. A light source 941 (e.g., a laser) may be provided adjacent to the window 937, and a light detector 942 may be provided adjacent to the window 938. The light source 941 is configured to emit light 945 that passes through the windows 937 and 938, and the light source 941 is optically coupled with the light detector 942. The light 945 is absorbed in part by the second gas 935. The amount of absorption of the light 945 is detected by the light detector 942 in order to determine the concentration of the measured species. The concentration of the measured species can then be used to calculate the concentration or flux of the radical species 927 flown into the chamber 936.

In an embodiment, the chamber 936 may also include a thermometer 925 or any other device capable of measuring temperature. The thermometer 925 may be used to control a temperature of the chamber 936. For example, the chamber 936 may be heated or cooled in order to drive particular reactions. Additionally, the chamber 936 may include a transducer 926. The transducer 926 may be used in conjunction with a throttle valve (e.g. throttle valve 733 in FIG. 7A) in order to control the pressure within the chamber 936.

Figure 10:
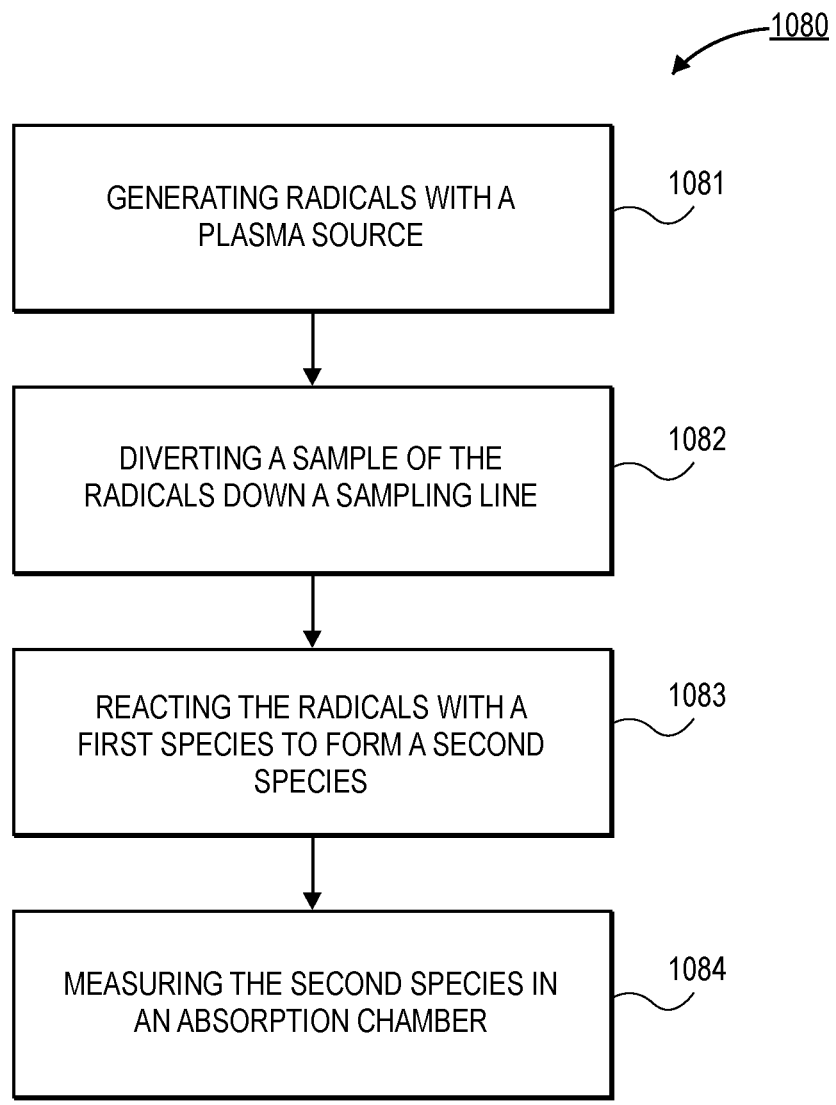
FIG. 10 is a process flow diagram for a process for measuring a radical flux in a semiconductor processing tool, in accordance with an embodiment.

Referring now to FIG. 10, a process flow diagram of a process 1080 to measure radical fluxes in a semiconductor processing tool is shown, in accordance with an embodiment. In an embodiment, the process 1080 may be implemented using any of the semiconductor processing tools described above that include a measurement line.

In an embodiment, the process 1080 may begin with operation 1081, which comprises generating radicals with a plasma source. In some embodiments, the radicals may be generated with a remote plasma source. Though other plasma sources may also be used, depending on the configuration of the semiconductor processing tool. Additionally, while referred to as radicals, it is to be appreciated that other species may also be generated in operation 1081. In a particular embodiment, the radicals (or species) that are generated are radicals (or species) that cannot be easily measured directly using laser absorption spectroscopy. That is to say, it would require significant expenditures in equipment and engineering in order to measure the radicals or species. For example, the radicals may include one or more of fluorine, oxygen, chlorine, sulfur, phosphorus, silicon, and hydrogen.

In an embodiment, the process 1080 may continue with operation 1082, which comprises diverting a sample of the radicals down a sampling line. In an embodiment, the radicals may be diverted down the sampling line before reaching the main processing chamber. In other embodiments, the radicals are diverted down the sampling line after reaching the main processing chamber. In yet another embodiment, the radicals are diverted down the sampling line after passing through the main processing chamber. In an embodiment, the downstream side of the sampling line may be coupled to a line before the pump of the semiconductor processing tool. For example, the downstream side of the sampling line may be provided between an isolation valve and the pump.

In an embodiment, the process 1080 may continue with operation 1083, which comprises reacting the radicals with a first species to form a second species. In a particular embodiment, the radical or species of interest may be fluorine. In such an embodiment, the first species may include one or more of $H_2$, $C_XH_YX_Z$ (where X is F or Cl), $C_XH_Y$, $NH_3$, $B_2H_6$, and $H_2O$. The reaction between F and the first species may produce a gas that includes a second species of HF, which is measureable by laser absorption spectroscopy. In another embodiment, the radical or species of interest may be chlorine. In such an embodiment, the first species may comprise one or more of $H_2$, $C_XH_YX_Z$ (where X is F or Cl), $C_XH_Y$, $NH_3$, $B_2H_6$, and $H_2O$. The reaction between Cl and the first species may produce a gas that includes a second species of HCl, which is measureable by laser absorption spectroscopy. In another embodiment, the radical or species of interest may be oxygen. In such an embodiment, the first species may comprise one or more of $C_XH_Y$, $H_2$, $NH_3$, and $B_2H_6$. The reaction between O and the first species may produce a gas that includes a second species that includes one or more of CO, $CO_2$, and $H_2O$, which are measurable by laser absorption spectroscopy. In yet another embodiment, the radical or species of interest may be hydrogen. In such an embodiment, the first species may comprise one or more of $NF_3$, $C_XF_YX_Z$ (where X is F or Cl), $Cl_2$, $F_2$, $SF_6$, $SiH_XF_{(4-X)}$, $SiH_XCl_{(4-X)}$, $GeH_XF_{(4-X)}$, and $GeH_XCl_{(4-X)}$. The reaction between H and the first species may produce a gas that includes a second species that includes one or more of HF and HCl, which are measureable by laser absorption spectroscopy. While several examples of material classes are shown, it is to be appreciated that any radical or species that can be reacted to form a new species that is measurable by laser absorption spectroscopy may be used in accordance with embodiments described herein.

In an embodiment, the process 1080 may continue with operation 1084, which comprises measuring the second species in an absorption chamber. In an embodiment, the absorption chamber may be similar to any of the measurement cell or measurement chambers described in greater detail above. For example, the absorption chamber may include a first window and a second window on opposite sides of the chamber. A light source (e.g., a laser) may emit light that passes through the first window and the second window. The light source is optically coupled to a light detector in order to determine a level of absorption provided by the second species. In some embodiments, the absorption chamber may be a different chamber than where the chemical reaction takes place. In other embodiments, the absorption chamber may be the same chamber where the chemical reaction takes place.

Figure 11A:
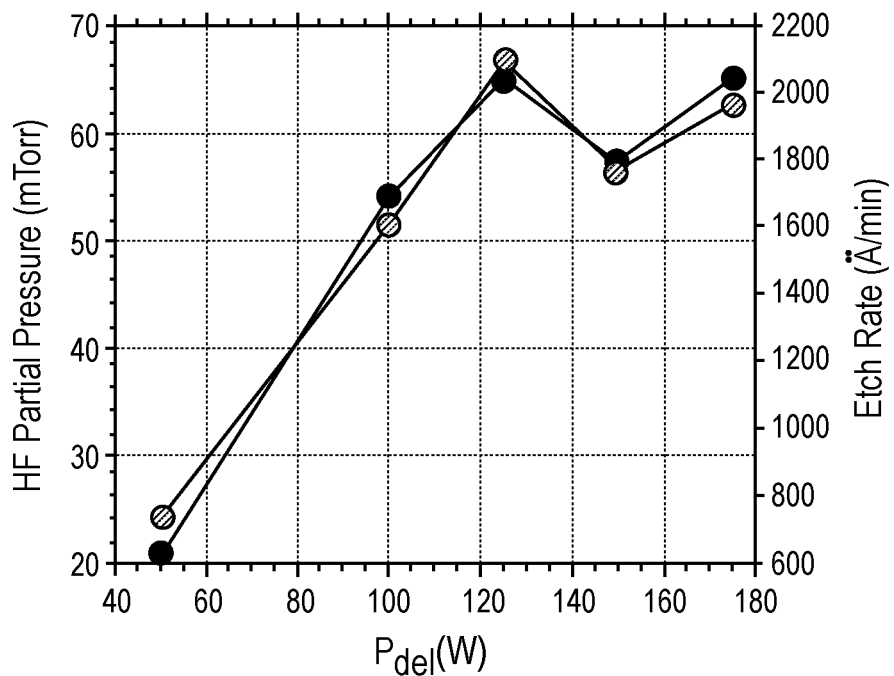
FIG. 11A illustrates a graph of the HF partial pressure and corresponding etch rate with respect to power, in accordance with an embodiment.
Figure 11B:
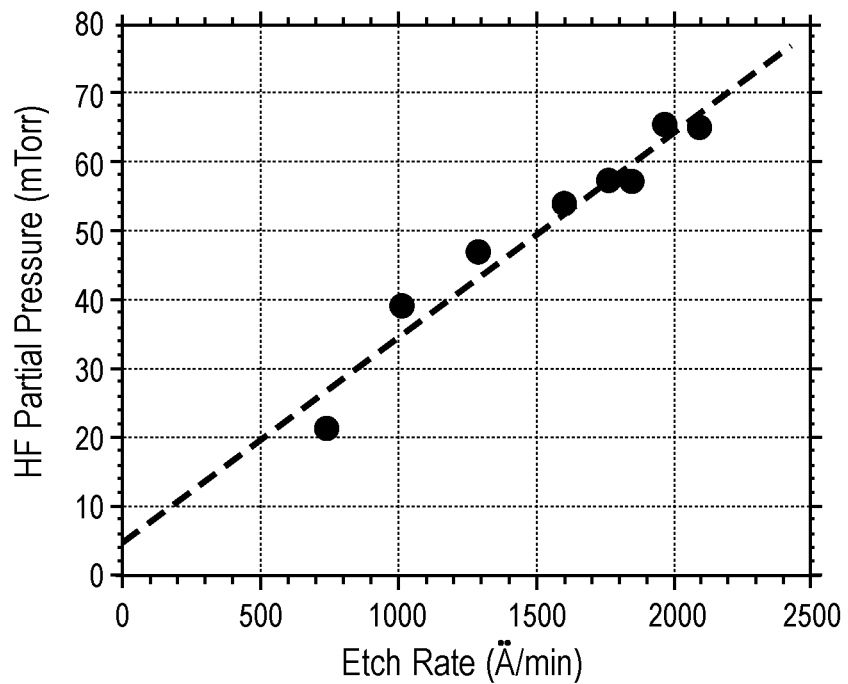
FIG. 11B illustrates a graph of the HF partial pressure with respect to etch rate, in accordance with an embodiment.

Referring now to FIGS. 11A and 11B, graphs that illustrate the relationship between measured partial pressures and etch rates are shown. As shown in FIG. 11A, the HF partial pressure increases up to approximately 125 W and then dips before going back up at 175 W. Similarly, the etch rate for the power sweep also exhibits the same dip and subsequent increase. That is, the measurement of the partial pressure mirrors the etch rate. Additionally, as shown in FIG. 11B, there is a strong linear trend between the etch rate data and the HF partial pressure data. As such, knowledge of the partial pressure of HF can be directly correlated to the etch rate expected on the substrate.

Figure 12:
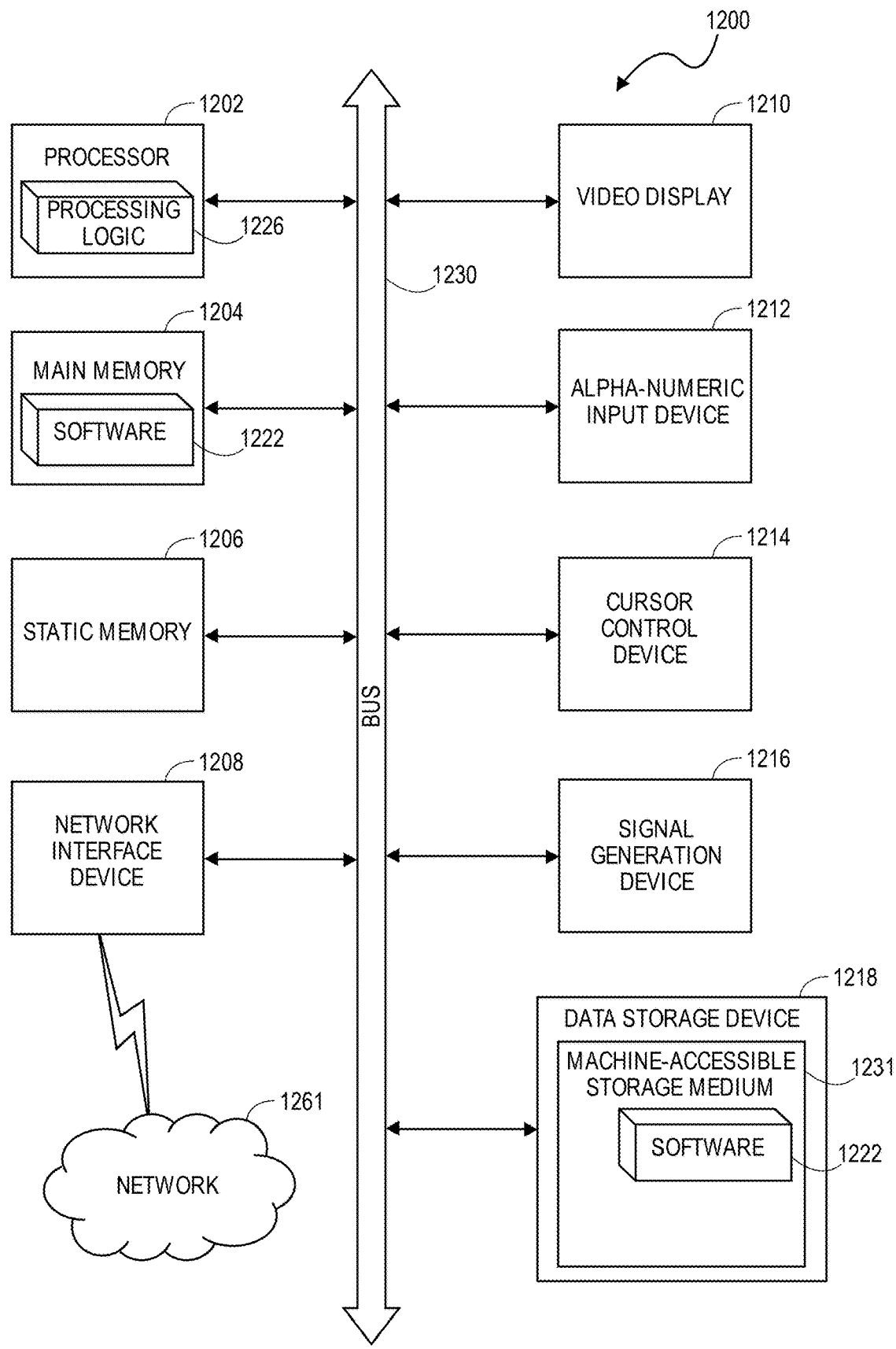
FIG. 12 illustrates a block diagram of an exemplary computer system that may be used in conjunction with a processing tool, in accordance with an embodiment.

Referring now to FIG. 12, a block diagram of an exemplary computer system 1200 of a processing tool is illustrated in accordance with an embodiment. In an embodiment, computer system 1200 is coupled to and controls processing in the processing tool. Computer system 1200 may be connected (e.g., networked) to other machines in a Local Area Network (LAN), an intranet, an extranet, or the Internet. Computer system 1200 may operate in the capacity of a server or a client machine in a client-server network environment, or as a peer machine in a peer-to-peer (or distributed) network environment. Computer system 1200 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1200, the term "machine" shall also be taken to include any collection of machines (e.g., computers) that individually or jointly execute a set (or multiple sets) of instructions to perform any one or more of the methodologies described herein.

Computer system 1200 may include a computer program product, or software 1222, having a non-transitory machine-readable medium having stored thereon instructions, which may be used to program computer system 1200 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1200 includes a system processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

System processor 1202 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1202 may also be one or more special-purpose processing devices such as an application specific integrated circuit (ASIC), a field programmable gate array (FPGA), a digital signal system processor (DSP), network system processor, or the like. System processor 1202 is configured to execute the processing logic 1226 for performing the operations described herein.

The computer system 1200 may further include a system network interface device 1208 for communicating with other devices or machines. The computer system 1200 may also include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium 1232 (or more specifically a computer-readable storage medium) on which is stored one or more sets of instructions (e.g., software 1222) embodying any one or more of the methodologies or functions described herein. The software 1222 may also reside, completely or at least partially, within the main memory 1204 and/or within the system processor 1202 during execution thereof by the computer system 1200, the main memory 1204 and the system processor 1202 also constituting machine-readable storage media. The software 1222 may further be transmitted or received over a network 1220 via the system network interface device 1208. In an embodiment, the network interface device 1208 may operate using RF coupling, optical coupling, acoustic coupling, or inductive coupling.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A semiconductor processing tool, comprising:
   a plasma source;
   a chamber coupled to the plasma source;
   a pump coupled to the chamber; and
   a sampling line, wherein the sampling line comprises:
      a reaction chamber; and
      an absorption chamber.

2. The semiconductor processing tool of claim 1, wherein the sampling line is configured to pull a sample from between the plasma source and the chamber.

3. The semiconductor processing tool of claim 1, wherein the sampling line is configured to pull a sample from the chamber.

4. The semiconductor processing tool of claim 1, wherein the sampling line is configured to pull a sample downstream of the chamber.

5. The semiconductor processing tool of claim 1, wherein a downstream side of the sampling line is coupled to the pump.

6. The semiconductor processing tool of claim 1, wherein the reaction chamber comprises:
a first gas input line coupled to the plasma source;
a second gas input line coupled to a reactant gas source; and
an output gas line coupled to the absorption chamber.

7. The semiconductor processing tool of claim 6, wherein the reaction chamber further comprises:
a temperature measurement device.

8. The semiconductor processing tool of claim 6, wherein the reaction chamber further comprises:
a transducer for controlling a pressure in the reaction chamber.

9. The semiconductor processing tool of claim 6, wherein the absorption chamber comprises:
a third gas input line coupled to the output gas line of the reaction chamber;
a second gas output line coupled to the pump;
a first window on a first surface of the absorption chamber;
a second window on a second surface of the absorption chamber opposite from the first surface;
a light source configured to emit light through the first window; and
a light detector configured to receive light through the second window.

10. The semiconductor processing tool of claim 9, wherein the absorption chamber further comprises a temperature measurement device.

11. The semiconductor processing tool of claim 9, wherein the absorption chamber further comprises a transducer to measure and/or control a pressure in the absorption chamber.

12. The semiconductor processing tool of claim 1, wherein the reaction chamber and the absorption chamber are configured to be a single chamber.

13. A method of determining a radical concentration, comprising:
generating radicals with a plasma source;
diverting a sample of the radicals down a sampling line;
reacting the radicals with a first species to form a second species in a reaction chamber of the sampling line; and
measuring the second species in an absorption chamber of the sampling line, wherein a measurement of the second species corresponds to a measurement of the radicals.

14. The method of claim 13, wherein the radicals comprise carbon, nitrogen, fluorine, chlorine, oxygen, sulfur, phosphorus, silicon, or hydrogen.

15. The method of claim 14, wherein the second species comprises HF, HCl, CO, $CO_2$, $H_2O$, OH, NH, $NH_2$, $NH_3$, HS, $H_2S$, PH, $PH_2$, $PH_3$, $C_xH_y$, SiH, $SiH_2$, $SiH_3$, $SiH_4$.

16. The method of claim 13, wherein the plasma source is a remote plasma source.

17. A semiconductor processing tool, comprising:
a remote plasma source;
a chamber fluidically coupled to the remote plasma source;
a pump fluidically coupled to the chamber; and
a sampling line that is fluidically in parallel with the chamber, wherein the sampling line comprises:
a reaction chamber; and
an absorption chamber.

18. The semiconductor processing tool of claim 17, wherein the reaction chamber and the absorption chamber are combined as a single chamber.

19. The semiconductor processing tool of claim 17, wherein the reaction chamber is configured to react radicals with a first species to produces a second species, and wherein the absorption chamber is configured to measure the second species.

* * * * *